(12) United States Patent
Zopf

(10) Patent No.: US 9,053,698 B2
(45) Date of Patent: Jun. 9, 2015

(54) JITTER BUFFER ENHANCED JOINT SOURCE CHANNEL DECODING

(71) Applicant: Broadcom Corporation, Irvine, CA (US)

(72) Inventor: Robert W. Zopf, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 72 days.

(21) Appl. No.: 13/925,616

(22) Filed: Jun. 24, 2013

(65) Prior Publication Data

US 2013/0282366 A1 Oct. 24, 2013

Related U.S. Application Data

(63) Continuation-in-part of application No. 13/748,904, filed on Jan. 24, 2013.

(60) Provisional application No. 61/835,944, filed on Jun. 17, 2013, provisional application No. 61/752,320, filed on Jan. 14, 2013, provisional application No. 61/706,328, filed on Sep. 27, 2012, provisional application No. 61/590,015, filed on Jan. 24, 2012.

(51) Int. Cl.
| | |
|---|---|
| G10L 19/00 | (2013.01) |
| H03M 13/29 | (2006.01) |
| H03M 13/00 | (2006.01) |
| H04L 1/00 | (2006.01) |
| H04L 1/18 | (2006.01) |
| H04J 3/06 | (2006.01) |

(52) U.S. Cl.
CPC ........... *G10L 19/00* (2013.01); *H03M 13/2957* (2013.01); *H03M 13/6306* (2013.01); *H03M 13/6312* (2013.01); *H04L 1/005* (2013.01); *H04L 1/0055* (2013.01); *H04L 1/1812* (2013.01); *H04J 3/0632* (2013.01)

(58) Field of Classification Search
CPC ........................................................ H04L 1/005
USPC .......................................... 375/340; 704/201
See application file for complete search history.

(56) References Cited

U.S. PATENT DOCUMENTS

| | | | |
|---|---|---|---|
| 2002/0166092 A1 | 11/2002 | Kyosti et al. | |
| 2005/0275573 A1* | 12/2005 | Raveendran | ................. 341/120 |
| 2006/0203943 A1 | 9/2006 | Scheim et al. | |
| 2010/0281089 A1 | 11/2010 | Vigoda et al. | |
| 2011/0087944 A1 | 4/2011 | Li et al. | |
| 2013/0188758 A1 | 7/2013 | Zopf | |

* cited by examiner

*Primary Examiner* — Michael Neff
(74) *Attorney, Agent, or Firm* — Fiala & Weaver P.L.L.C

(57) ABSTRACT

Methods, systems, and apparatuses are provided for performing jitter buffer enhanced joint source channel decoding. Jitter buffer enhanced joint source channel decoding may be performed in a manner that exploits parameter domain correlation. A jitter buffer stores hard bits of properly channel decoded packets, and a secondary jitter buffer is implemented to store soft bits associated with packets that are improperly channel decoded. Joint source channel decoding may be delayed to perform channel decoding of a frame in the penultimate position of the jitter buffer. The soft bits stored in the secondary jitter buffer as well as hard bits stored in the jitter buffer, which may include future frames, are utilized to perform channel decoding. The delayed jitter buffer enhanced joint source channel decoding may also be extended to iteratively perform channel decoding for giving frames at each position in the jitter buffer as they traverse the jitter buffer.

20 Claims, 7 Drawing Sheets

US 9,053,698 B2

JITTER BUFFER ENHANCED JOINT SOURCE CHANNEL DECODING

CROSS-REFERENCE TO RELATED APPLICATIONS

This application claims priority to U.S. Provisional Patent Application No. 61/835,944, filed Jun. 17, 2013, and entitled "Jitter Buffer Enhanced Joint Source Channel Decoding," which is incorporated by reference herein.

This application is a continuation in part of U.S. patent application Ser. No. 13/748,904, filed on Jan. 24, 2013 and entitled "Joint Source Channel Decoding Using Parameter Domain Correlation," which is incorporated by reference herein and which claims priority to the following provisional applications, each of which is incorporated by reference herein: U.S. Provisional Patent Application No. 61/590,015, filed Jan. 24, 2012, U.S. Provisional Patent Application No. 61/706,328, filed Sep. 27, 2012, and U.S. Provisional Patent Application No. 61/752,320, filed Jan. 14, 2013.

This application is also related to the following U.S. patent applications, each of which also claims the benefit of U.S. Provisional Patent Application Nos. 61/590,015 and 61/706,328, and each of which is incorporated by reference herein:

U.S. patent application Ser. No. 13/749,064, filed on Jan. 24, 2013 and entitled "Modem Architecture for Joint Source Channel Decoding";

U.S. patent application Ser. No. 13/749,187, filed on Jan. 24, 2013 and entitled "Modified Joint Source Channel Decoder"; and U.S. patent application Ser. No. 13/748,949, filed on Jan. 24, 2013 and entitled "Constrained Soft Decision Packet Loss Concealment."

BACKGROUND

1. Technical Field

The subject matter described herein relates to systems and methods for performing joint source channel decoding.

2. Background Art

The concept of channel capacity was introduced in C. E. Shannon, "A Mathematical Theory of Communication," Bell System Technical Journal, vol. 27, pp. 379-423 and 623-656, July and October, 1948. In this work, Shannon stated that a source with entropy H can be reliably transmitted over a channel with capacity C as long as H<=C. Shannon also introduced the Separation Theorem which stated that the maximum capacity is achievable by treating the source and channel independently. In accordance with this model, and referring to FIG. 1, a source coder is first applied to reduce the rate down to H, and a channel code is subsequently applied (e.g., in a system 102). At the receiver, the channel decoder is unaware of the type of source and outputs the most probable codeword (e.g., in system 102). The source decoder then reconstructs the source without any knowledge of the source statistics (e.g., in system 102).

However, Shannon's Separation Theorem only holds true in the case of infinite complexity and delay, as well as a non time varying (AWGN) channel. When operating with finite complexity and delay on a channel that may vary in time (fading), better performance is generally achievable by jointly optimizing the source and channel coder. In Joint Source-Channel Coding (JSCC), the source and channel are jointly encoded, while in Joint Source-Channel Decoding (JSCD), the source and channel are jointly decoded. These cases are depicted in FIG. 1 as systems 104 and 106, respectively. Of course, a system may also employ both JSCC and JSCD. However, most communications systems employed to date employ little JSCC or no JSCC. Significant gains can still be achieved in these systems by incorporating JSCD.

In audio applications, data packets or data frames that include audio content and have been properly decoded by a channel decoder may be stored in a jitter buffer prior to being passed to a speech decoder. This may help maintain a smooth audio output through the speech decoder. A jitter buffer may also allow for the insertion of received out-of-order packets into the data stream. However, to date, jitter buffers and the delay inherent therein have not been exploited to perform JSCD.

BRIEF SUMMARY

Methods, systems, and apparatuses are described for performing jitter buffer enhanced joint source channel decoding, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. The left-most digit(s) of a reference number identifies the drawing in which the reference number first appears.

DETAILED DESCRIPTION

1. Introduction

Figure 1:
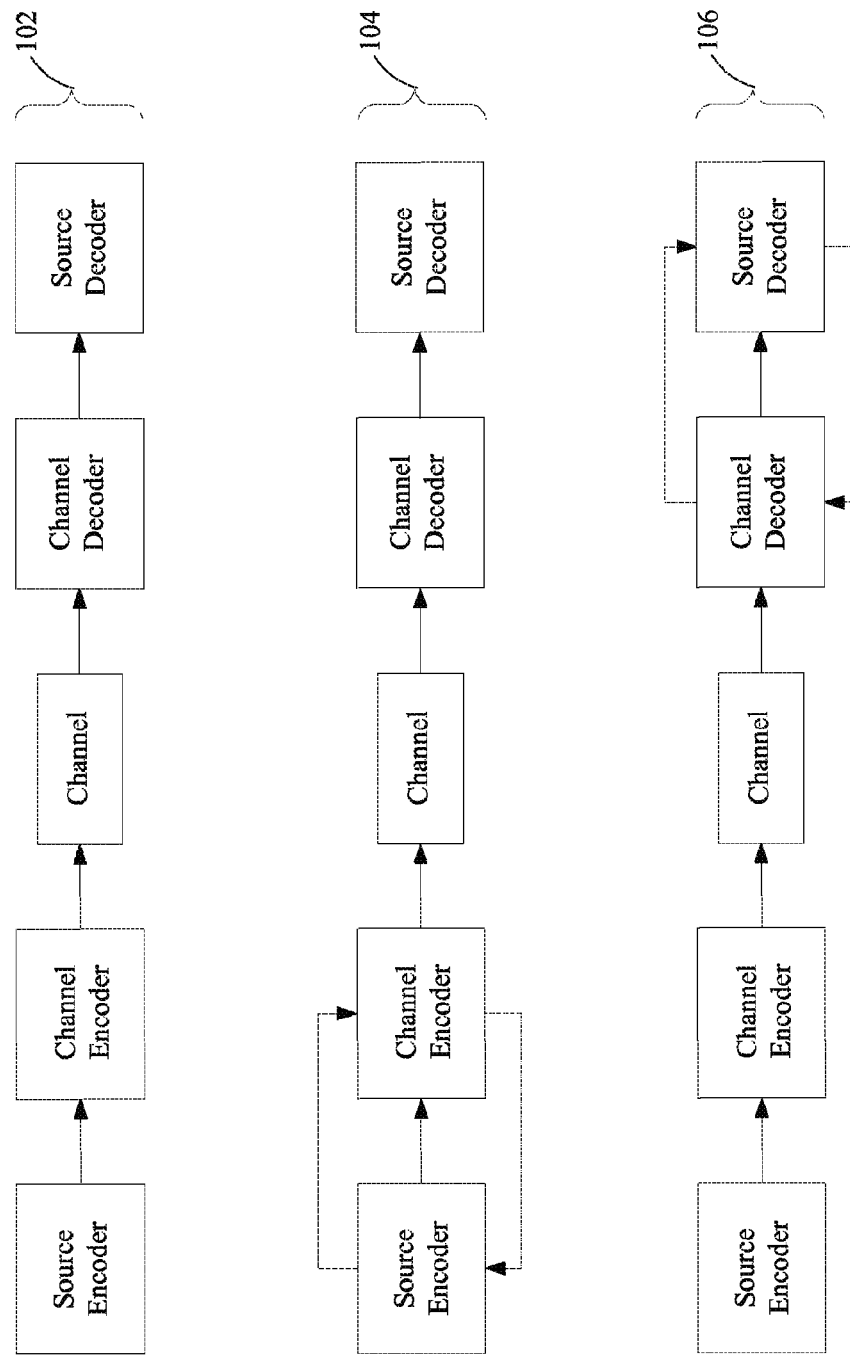
FIG. 1 is a systems block diagram of various encoding and decoding implementations.

The present specification discloses numerous example embodiments. The scope of the present patent application is not limited to the disclosed embodiments, but also encompasses combinations of disclosed embodiments, as well as modifications to disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, terminology used herein to refer to decoder decisions and other information as "hard" refers to whether the decision or information represents actual, perceived data bits (e.g., a '1' (logical high signal value) or a '0' (logical low signal value)). The "hard" values are the actual data bits and/or what a decoder has determined the actual data bits to be. Terminology used herein to refer to decoder decisions and other information as "soft" refers to whether the decision or information are representations of the probability (e.g., conditional probability) and/or the likelihood of a given bit in the data stream being a '1' or a '0'. "Soft bits," for example, may be represented as a decimal number with a theoretical range between 0 and 1 (e.g., 0.2138 or 0.9853) for a probability, where a value less than 0.5 indicates a likelihood of the actual data bit (i.e., "hard bit") being a '0', while a value greater than 0.5 indicates a likelihood of the actual data bit (i.e., "hard bit") being a '1' (a value of 0.5 indicates an equal probability of '0' or '1'). Similarly, a "soft bit" value may theoretically range from $-\infty$ (negative infinity) to $+\infty$ (positive infinity) for a log likelihood ratio (LLR), where a value less than zero indicates a likelihood of a '0', a value greater than zero indicates a likelihood of a '1', and a value of zero indicates an equal likelihood of a '0' or a '1'. For probabilities and LLRs, the probabilities and likelihoods are stronger for a given data stream bit value (a '1' or a '0') as a probability or LLR approaches the theoretical limits (high or low) of their respective ranges. Still further, references in the specification to "extrinsics," "extrinsic data," or "extrinsic information" refer to information derived from redundant information in the code (e.g., data and parity bits, and/or the like). "Extrinsic information" is used by decoders to facilitate channel decoding, as described herein. Still further, terminology used herein such as "about," "approximately," and "substantially" have equivalent meanings and may be used interchangeably.

Numerous exemplary embodiments are now described. Any section/subsection headings provided herein are not intended to be limiting. Embodiments are described throughout this document, and any type of embodiment may be included under any section/subsection. Furthermore, disclosed embodiments may be combined with each other in any manner.

2. Example Embodiments

The examples described herein may be adapted to various types of wired and wireless communications systems, computing systems, communication devices, and/or the like, which include encoders and/or decoders. Furthermore, additional structural and operational embodiments, including modifications/alterations, will become apparent to persons skilled in the relevant art(s) from the teachings herein.

In embodiments, communication systems may be based on the Long Term Evolution (LTE) IP-based standard for wireless data communications. LTE provides high access rates, low latencies, reduced data delivery costs, and simplification of network architecture. LTE is a packet-based network as opposed to a circuit-switched based network in $2^{nd}$ Generation and $3^{rd}$ Generation systems. As a result, packets incur delay and jitter, arriving with varying amounts of delay and potentially out of order. To combat this, LTE receivers employ a jitter buffer, similar to Voice over Internet Protocol (VoIP) based telephony. The jitter buffer holds received, channel decoded packets for an adjustable amount of time before playback. Packets arriving late but within the jitter buffer holding time are played back, and out-of-order packets can be re-ordered. The penalty associated with this is increased delay incurred by the jitter buffer. Typically, the jitter buffer delay is slowly adjusted according to the jitter recently observed in incoming packets.

Embodiments may also provide Voice over LTE (VoLTE) services that are implemented as VoIP, which is supported by the IP Multimedia Subsystem (IMS) with specific profiles for control and media planes of voice service defined by Global System for Mobile Communications Association (GSMA) in Permanent Reference Document (PRD) IR.92 titled "IMS Profile for Voice and SMS" (v4.0, Mar. 22, 2011) (hereinafter "IR.92").

Communication system bandwidth used by data applications may in many cases be greater than the bandwidth for voice calls, but voice applications remain an important part of communication system utilization. It follows then that voice quality will remain a very important metric to consumers and companies which provide services and products. The embodiments described herein (e.g., for VoLTE) provide improved voice quality, decreased packet loss rates, and reduced channel noise for communication systems without undue decreases in network capacity and/or increased power consumption.

LTE communication systems may encode and decode data that is transmitted on communication channels using turbo coding. Example embodiments described herein based on turbo coding in LTE take advantage of jitter buffer enhanced joint source channel decoding (JSCD) as well as redundancies and correlations present in VoLTE. For example, data may be encoded using joint source channel coding (JSCC). This particular type of encoder may be paired with a jitter buffer enhanced JSCD turbo decoder for decoding purposes. In JSCC, the source (e.g., speech related data) and channel (e.g., packet related data) are jointly encoded. In JSCD, the source and channel are jointly decoded. Embodiments described herein may implement JSCD even without JSCC. JSCD as described in the example embodiments may allow for an optimized channel capacity while providing joint decoding benefits such as improved communication efficiency, data integrity, and performance as well as adherence to VoLTE standards.

Turbo decoding generates a soft bit decision representation of the data bits in a data stream that represents the likelihood of a given bit in the data being a logical "1" or a logical "0". These likelihoods may be presented as a ratio of probabilities, as will be discussed in further detail below. In example embodiments, a turbo decoder may include two or more decoders which work cooperatively in order to refine and improve the estimate of the original data bits over one or more iterations until the soft decisions converge on a stable set of values or until the preset maximum number of iterations is reached. The decoders may be based on the MAP (maximum a-posteriori probability) algorithm and may output the soft decision information determined from received data and corresponding parity bits. The converged soft decisions may then be used to recover the original binary data sequence. The recovered data sequences may be stored as hard bits in a jitter buffer before being processed by a speech decoder.

Embodiments presented herein improve JSCD by exploiting delay in the jitter buffer. The embodiments presented herein may exploit jitter buffer delay by delaying the performance of JSCD for data packets that have failed a previous channel decoding operation and allowing additional frames (including future frames) to arrive and be used for JSCD. The embodiments presented herein may also exploit jitter buffer delay through techniques used in JSCD to derive extrinsics from a-priori information in a source signal. For instance, the techniques described herein are applicable to source signals such as speech, streaming video, gaming, and/or other applications where the source is predictable from past and future information. Indeed, the described jitter buffer enhanced techniques may be applied to all traffic if header information is considered. The techniques described herein may be used in conjunction with correlation of bits and/or parameters in source signals. In some exemplary embodiments, jitter buffer delay may be exploited in conjunction with correlation of various types of parameters in voice data packets, such as, but not limited to, speech coding parameters and packet header parameters. While, for illustrative purposes, various embodiments described herein refer to parameter-based correlation techniques, contemplated implementations of jitter buffer enhanced JSCD described herein are not so limited. As an illustrative example of jitter buffer enhanced JSCD, consider a series of frames in which JSCD with parameter domain correlation for pitch is utilized. In a sample where the speech signal goes from a noisy unpredictable waveform (e.g., unvoiced speech) to periodic (e.g., voiced speech), the pitch in the unvoiced section is random and uncorrelated with the pitch in the voiced speech. At the onset of the voiced signal, using only past speech will lead to a very poor prediction of the pitch. If future frames were available using jitter buffer enhanced JSCD, the pitch could be more accurately predicted. In another example, consider a voiced section of speech with a pitch contour of {40, 40, 44, 48, ... }. In the case where the frame with pitch=44 is lost, using only past pitch values gives no indication that the pitch is increasing and will likely result in a pitch prediction of around '40'. However, if a future frame value (e.g., '48') is available, using simple interpolation would predict the exact pitch value of '44'.

In a case of predicting the contents of a packet header, various headers in the LTE protocol stack contain a sequence number (SN). For example, the PDCP layer contains a 7-bit SN and the RLC layer contains a 5-bit SN. While in most cases a previous packet with SN=n allows for the prediction of the next packet be SN=n+1, as previously mentioned, packets in an IP network may arrive out of order. If all previous packets are accounted for, the next packet may have SN=n+m, where m>0 and the probability of each m depends on the current jitter statistics in the network. For simplicity in this example, assume that m>2 is highly unlikely. Hence, packets are out of order by at most one packet. If packets arrive out of order, observing packet SN=n+1 in the jitter buffer indicates with high likelihood that the current packet is SN=n+2.

While prediction of the sequence number with an error of 1 may not be an overly complex concept, the equivalent binary prediction illuminates complicating subtleties. For the RLC layer case, the SN has a range of 0-31. Once 31 is reached, the SN goes back to 0. In the worst case, the out of sequence error occurs when SN=31. In this case, predicting that SN=31 is problematic because it is equal to SN=0. In binary, '31'=11111 and '0'=00000. An error of a single value results in the incorrect prediction of all five binary values. Likewise, four bits will be incorrectly predicted at '15,' three bits at '7,' and two bits at '3'. Similar prediction issues exist with other header fields where knowledge of the future and the past values greatly improves the prediction confidence of the current packet. Likewise, speech parameters in addition to pitch also benefit from knowledge of both past and future values. The techniques described herein provide for such improvements in prediction.

For instance, methods, systems, and apparatuses are provided for jitter buffer enhanced joint source channel decoding. In an example aspect, a method is disclosed. The method includes storing a plurality of hard bits in a first memory buffer. The method also includes storing a plurality of soft bits in a second memory buffer. The method further includes performing joint source channel decoding on a first subset of the plurality of soft bits based upon one or more of at least a portion of the plurality of hard bits and a second subset of the plurality of soft bits. The first subset is associated with a first segment of an audio signal, and the one or more of at least a portion of the plurality of hard bits and the second subset are associated with a second segment of the audio signal that was generated subsequent to the first segment.

In another example aspect, a method is disclosed. The method includes storing a plurality of hard bits in a first memory buffer, and also includes storing a plurality of soft bits in a second memory buffer, the plurality of soft bits comprising two or more subsets of soft bits. The method further includes performing joint source channel decoding on each of the two or more subsets based upon at least a portion of the plurality of hard bits and each other subset. A first subset of the two or more subsets is associated with a first segment of an audio signal. One or more of the at least a portion of the plurality of hard bits and a second subset of the two or more subsets are associated with a second segment of the audio signal that was generated subsequent to the first segment.

In yet another example aspect, a system is disclosed that includes a first memory buffer, a second memory buffer, and a channel decoder. The first memory buffer is configured to store a plurality of hard bits. The second memory buffer is configured to store a plurality of soft bits. The channel decoder is configured to perform joint source channel decoding on a first subset of the plurality of soft bits based upon one or more of at least a portion of the plurality of hard bits and a second subset of the plurality of soft bits. The first subset is associated with a first segment of an audio signal, and the one or more of at least a portion of the plurality of hard bits and the second subset of the plurality of soft bits are associated with a second segment of the audio signal that was generated subsequent to the first segment.

Various example embodiments are described in the following subsections. In particular, an example LTE architecture embodiment is described, followed by example embodiments for JSCD and jitter buffer enhanced JSCD. Jitter buffer enhanced JSCD embodiments that exploit speech coding parameter correlation and packet header parameter correlation are subsequently described. This is followed by a description of further example jitter buffer enhanced JSCD advantages and embodiments. Next, example operational embodiments are described. Finally, an example computer-implemented embodiment is described.

3. Example LTE Architecture Embodiment

Figure 2:
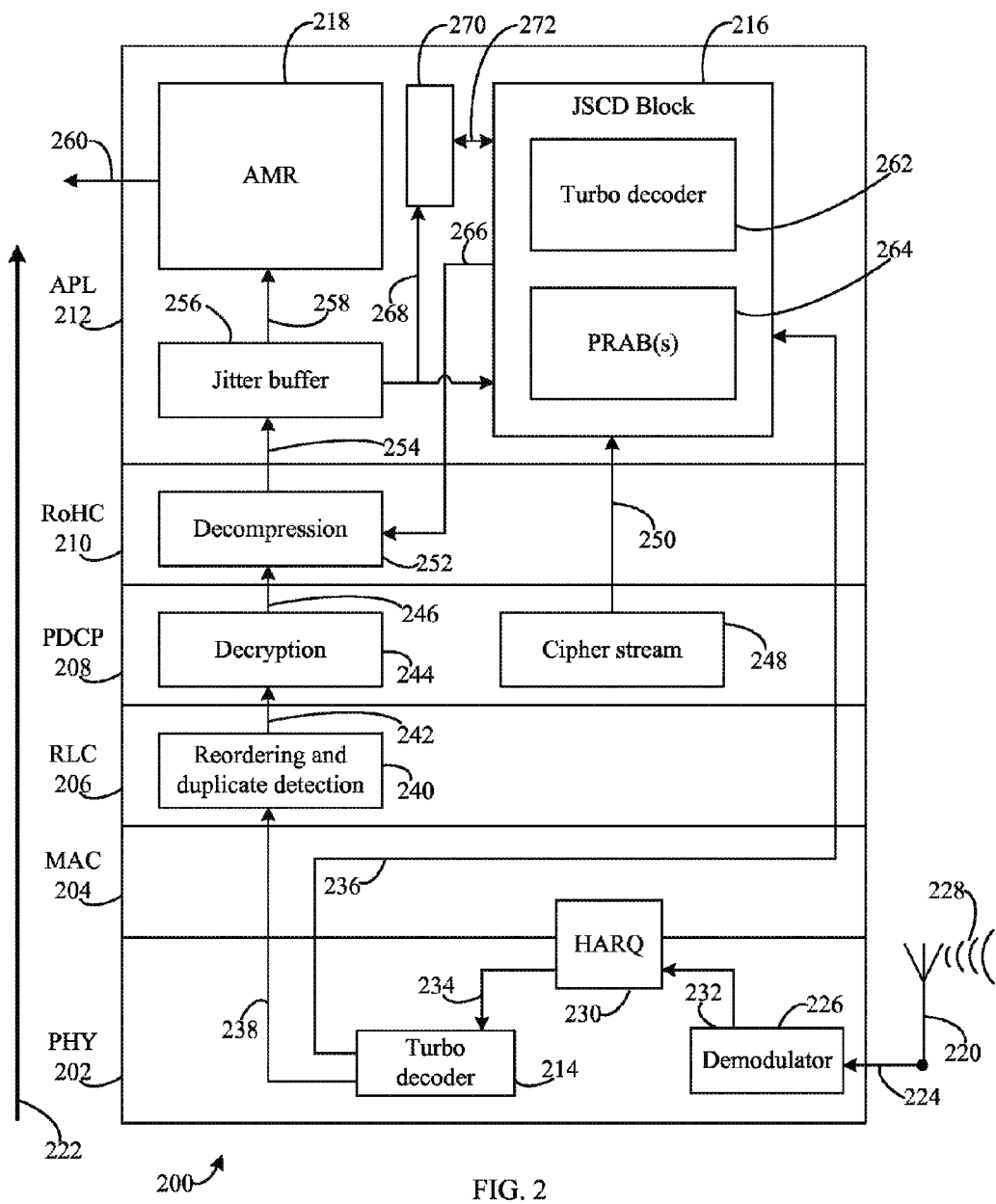
FIG. 2 is a block diagram of a portion of a long term evolution standard receiver architecture, according to an exemplary embodiment.

An LTE receiver, e.g., an LTE modem, in a communication system may be configured in various ways to decode received data streams utilizing JSCD, in embodiments. For example, FIG. 2 shows a block diagram of an LTE modem architecture (hereinafter "LTE architecture") 200, according to an embodiment. LTE architecture 200 includes circuitry corresponding to the layers associated with the LTE protocol. The layers include a physical (PHY) layer 202, a medium access control (MAC) layer 204, a radio link control (RLC) layer 206, a packet data convergence protocol (PDCP) layer 208, a robust header compression (RoHC) layer 210, and an application (APL) layer 212. LTE architecture 200 also includes a first turbo decoder 214 in PHY layer 202, a JSCD block (channel decoder) 216 in APL layer 212 as shown, an adaptive multi-rate speech decoder (hereinafter, "AMR") 218 in APL layer 212, and an antenna 220. LTE architecture 200 and each of the components included therein may include functionality and connectivity beyond what is shown in FIG. 2, as would be apparent to persons skilled in relevant art(s). However, such additional functionality is not shown in FIG. 2 for the sake of brevity.

As shown in FIG. 2, an arrow 222 indicates the general flow of the progression of data through the LTE protocol stack from PHY layer 202 to APL layer 212. It should be noted that the progression of data may deviate from the flow indicated by arrow 222 and that the LTE protocol stack may include fewer layers or additional layers (not shown).

The PHY layer 202 includes channel coding, error detection, modulation/demodulation, and/or other procedures to handle power control, multi-antenna operation, and/or the like. PHY layer 202 is based on orthogonal frequency division multiple access (OFDMA) for downlink communications and single carrier frequency division multiple access (SC-FDMA) for uplink communications. As shown, PHY layer 202 includes a demodulator 226, a Hybrid Automatic Repeat Request (HARQ) block 230, and first turbo decoder 214. Antenna 220 receives incoming data signals on a data channel 228 and transmits the received data signal to demodulator 226 via a line 224. Demodulator 226 demodulates the received data signal and transmits the demodulated data to HARQ block 230 via a line 232. HARQ block 230 may request a retransmission of a data packet if an error is detected in the data packet. If retransmission is completed or not required, the channel data is then transmitted to first turbo decoder 214 via a line 234. First turbo decoder 214 decodes the channel data (which is encrypted data) to generate soft bits and transmits the encrypted soft bits to APL layer 212 via a line 236. First turbo decoder 214 also decodes the channel data to generate hard bits (the decoded channel data bits received via the data stream, i.e., the logical "1" or logical "0" that the decoder has determined to be the actual data bits) and transmits the hard bits to MAC layer 204 via a line 238.

MAC layer 204 functions include the mapping and multiplexing of logical channels to transport channels. MAC layer 204 also handles the physical layer retransmissions (e.g., performed via HARQ block 230) which are applied to voice due to the low delay associated with voice packets. As shown, HARQ block 230 overlaps with MAC layer 204 as well as with PHY layer 202. That is, MAC layer 204 may control, in full or in part, the actual physical retransmission that occurs in PHY layer 202. Scheduling is also implemented in MAC layer 204 with priority handling to ensure a sufficient level of Quality of Service. RLC layer 206 handles retransmissions and segmentation. As shown, RLC layer 206 includes reordering and duplicate detection block 240 which corrects out of order packet sequences and duplicate packets (e.g., caused during handoffs). Data is transmitted from RLC layer 206 to PDCP layer 208 via a line 242. PDCP layer 208 handles ciphering and decryption. As shown, PDCP layer 208 includes a decryption block 244 and a cipher stream block 248. Decryption block 244 uses a cipher to decode encrypted data passed from the lower layers and transmit the decoded data to RoHC layer 210 via a line 246. Cipher stream block 248 provides the cipher to APL layer 212, via a line 250, in order to allow applications and/or circuitry in APL layer 212 to properly decrypt encrypted data (e.g., encrypted soft bits provided to APL layer 212 via line 236). RoHC layer 210 supports robust header compression as specified in $3^{rd}$ Generation Partnership Project Technical Specification (3GPP TS) 36.323, Internet Engineering Task Force (IETF) Request for Comments (RFC) 3095, and IETF RFC 4815. As shown, RoHC layer 210 includes a decompression block 252 which decompresses Internet Protocol (IP) packet headers for transmission to APL layer 212 via a line 254.

APL layer 212 supports applications and services such as data buffering and speech decoding. As shown, APL layer 212 includes a jitter buffer 256, JSCD block 216, AMR 218, and a memory 270. Jitter buffer 256 buffers voice data for delivery of the voice data via a line 258 to AMR 218 to allow for smooth output of decoded speech by AMR 218. Jitter buffer 256 may also provide voice data to JSCD block 216 and/or PRAB(s) 264 via a line 268. Further jitter buffer embodiments are described in detail below. In embodiments, AMR 218 may be a narrow-band multi-rate speech decoder (AMR-NB). AMR 218 outputs decoded speech via a line 260.

JSCD block 216 includes a second turbo decoder 262 and a Packet Redundancy Analysis Block (PRABs) 264 (i.e., packet redundancy analyzer). JSCD block 216 also includes modules, blocks, circuitry, and/or applications for data storage (not shown), for encrypting and/or decrypting data (not shown), for performing data transformations on soft bits to pass between encrypted and decrypted domains (not shown), and for routing received soft bits within the JSCD block 216 based upon an indication of whether errors are present in a data packet or not (not shown). JSCD block 216 receives encrypted soft bits via line 236, and second turbo decoder 262 performs its decoding operations based on the received encrypted soft bits and based on extrinsic data inputs received from one or more PRAB sub-block modules in PRAB 264, discussed in further detail below.

The resulting decoded data based on the hard decision of second turbo decoder 262 is decrypted in JSCD block 216 and transmitted to decompression block 252 where the decrypted, decoded data is re-inserted into the data stream. It should be noted, however, that in various embodiments, the hard decision data output by turbo decoder 262 may be provided to different elements and/or layers depicted in LTE architecture 200.

Second turbo decoder 262 provides for an additional turbo decoder that runs in APL layer 212 (in addition to turbo decoder 214 that runs in PHY layer 202). Running in APL layer 212 allows the additional turbo decoder to be configurable and flexible in application without modifying or affecting performance of first turbo decoder 214 in PHY layer 202. For example, first turbo decoder 214 is agnostic with respect to source signal information within a given packet, but second turbo decoder 262 may be configured in APL layer 212 to utilize packet information to improve channel decoding. That is, first turbo decoder 214 performs conventional channel decoding operations, while second turbo decoder 262 is configured to perform JSCD utilizing packet information. LTE architecture 200 also provides for transparent layers through which soft bits generated by first turbo decoder 214 can be passed to APL layer 212 for use by JSCD block 216 and the elements therein. For example, if it is determined that a data packet is "good" (e.g., no errors), the soft bits may be provided to a Packet Redundancy Analysis Block(s) (PRABs) to update PRAB states, whereas if it is determined that a data packet is "bad" (e.g., has errors), the soft bits may be provided to perform JSCD in APL layer 212. Likewise, cipher stream block 248 can provide a cipher stream for use by JSCD block 216 in APL layer 212.

Memory 270 may receive hard bits, probability density functions (PDFs), and/or other information via line 268 from jitter buffer 256 and/or via a line 272 from JSCD block 216. Memory 270 may store such received data for use by JSCD block 216. The received data may include data related to past, present, and/or future frames. JSCD block 216 receives data stored in memory 270 via line 272 and receives data from jitter buffer 256 via line 268. Memory 270 may be any type of memory or buffer (i.e., memory buffer). Memory 270 may be sized to store any amount of information/data, and the size of memory 270 may be dynamically configured. While shown as a single, separate block in FIG. 2, memory 270 may be included within JSCD block 216 or any other component described herein (e.g., any component of LTE architecture 200), and memory 270 may comprise one or more physical and/or logical partitions, as would be understood by persons of skill in the relevant art(s) having the benefit of this disclosure.

LTE architecture 200 and each of the elements included therein may be implemented in hardware, or a combination of hardware and software and/or firmware. Further details concerning an example modem architecture that supports JSCD, such as that shown in FIG. 2 or alternative implementations thereof, may be found in commonly-owned co-pending U.S. patent application Ser. No. 13/749,064, entitled "Modem Architecture for Joint Source Channel Decoding" and filed on Jan. 24, 2013, the entirety of which is incorporated by reference as if fully set forth herein.

4. Example Joint Source Channel Decoder Embodiments

As noted in the above-described LTE architecture 200, a receiver may be configured in ways to perform joint source channel decoding (JSCD). For example, a joint source channel decoding embodiment using the Long Term Evolution (LTE) standard and turbo decoding is described in this section. For instance, a JSCD block (e.g., JSCD block 216) may be adapted to perform joint source channel decoding as described herein, according to embodiments.

JSCD block 216 functions by injecting a-priori information into each of a first Maximum A-posteriori (MAP) decoder (non-interleaved) and a second MAP decoder (interleaved) of a modified turbo decoder. The first and second MAP decoders perform decoding to converge on a hard decision (representing the determination of the decoders of the actual data bits in a data packet) or until a predetermined number of iterations are performed. Some previous solutions perform JSCD by injecting a-priori information into only a non-interleaved MAP decoder. JSCD block 216 avoids positive feedback of source statistics from one MAP decoder to the other by subtracting out extrinsic data of the source from the soft bit outputs of the MAP decoder (e.g., log likelihood ratios (LLRs) representing the "soft decision" of a MAP decoder with respect to whether a given bit in a data stream is likely to be a "1" or a "0"). In embodiments, the source statistics may be one or more probabilities that incoming data bits are ones or zeroes based upon the received data bits. The soft bits resulting from this subtraction are input to a Packet Redundancy Analysis Block which generates extrinsic information to be provided to the companion MAP decoder along with extrinsic information from the first MAP decoder. Accordingly, JSCD block 216 performs JSCD by injecting a-priori information into both the first and second MAP decoders without feedback of source statistics. It has been observed that this doubles an improvement achievable when injecting a-priori information into only a non-interleaved MAP decoder. JSCD block 216 and each of the elements included therein may be implemented in hardware, or a combination of hardware and software and/or firmware. Further details concerning example JSCD blocks with modified turbo decoder architectures that support JSCD, such as that described above or alternative implementations thereof, may be found in commonly-owned co-pending U.S. patent application Ser. No. 13/749,187, entitled "Modified Joint Source Channel Turbo Decoder" and in commonly-owned co-pending U.S. patent application Ser. No. 13/748,904, entitled "Joint Source Channel Decoding Using Parameter Domain Correlation" each filed on Jan. 24, 2013, and each of which is incorporated by reference in its entirety as if fully set forth herein.

The next section describes JSCD embodiments in the context of JSCD block 216 as described above, in which jitter buffer enhanced JSCD is utilized to improve channel decoding. However, the JSCD techniques that will be described are not limited to that embodiment.

5. Example Embodiments for Jitter Buffer Enhanced Joint Source Channel Decoding

As noted above, in Joint Source Channel Decoding (JSCD), the source and channel are jointly decoded. JSCD may be performed in accordance with the embodiments described above. In accordance with embodiments described in this section, JSCD performance is enhanced using a jitter buffer implementation, unlike previous solutions which only utilized jitter buffers for storing channel decoded hard bits. In embodiments, a second jitter buffer is utilized in addition to jitter buffer 256. The second jitter buffer is configured to store the soft information (e.g., soft bits) of the packets that fail initial or previous channel decoding attempts. This initial or previous channel decoding includes the PHY layer 202 decoding (e.g., by first turbo decoder 214), and potentially a first-pass APL layer 212 decoding (e.g., by an optional JSCD block as described below). The hard bits of a packet that passes an initial or previous decoding are routed to jitter buffer 256. The soft bits of packets that fail decoding are routed to the second jitter buffer.

Figure 3:
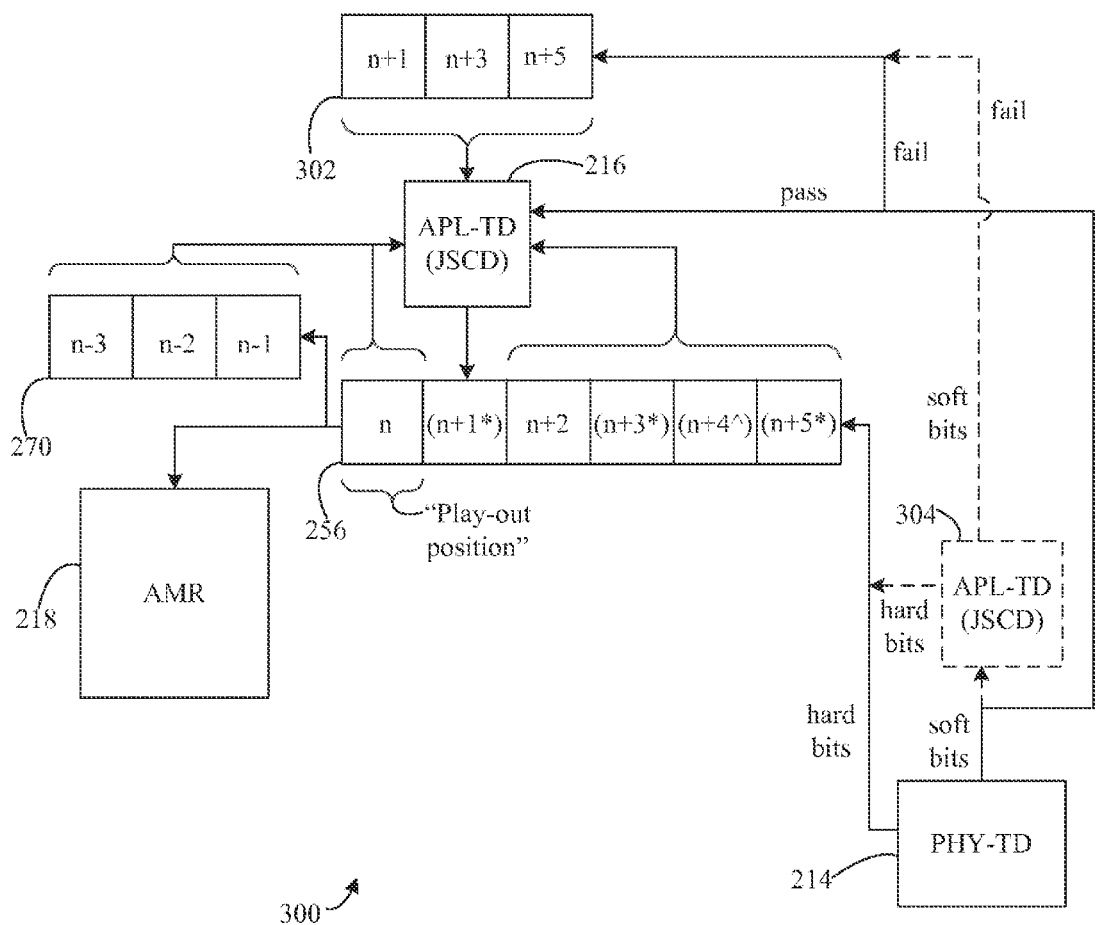
FIG. 3 is a block diagram of a portion of a jitter buffer enhanced JSCD implementation, according to another exemplary embodiment.

For example, FIG. 3 shows a block diagram of a jitter buffer implementation 300, according to an embodiment. Jitter buffer implementation 300 may be a further embodiment of a portion of LTE architecture 200, shown in FIG. 2. Jitter buffer implementation 300 includes jitter buffer 256, first turbo decoder 214, JSCD block 216, and AMR 218, as previously shown in FIG. 2. Jitter buffer 256 may be any buffer or memory (i.e., a memory buffer) that is configured to store a plurality of hard bits and may be sized to store any plurality of hard bits or subsets thereof. As shown in FIG. 3, jitter buffer implementation 300 also includes a secondary jitter buffer 302 and an optional JSCD block 304. Secondary jitter buffer 302 may be any buffer or memory (i.e., a memory buffer) that is configured to store a plurality of soft bits and may be sized to store any plurality of soft bits or subsets thereof. The size of secondary jitter buffer 302 may be dynamically configured. While shown as a single, separate block in FIG. 3, secondary jitter buffer 302 may be included within jitter buffer 256, JSCD block 216 or any other component described herein (e.g., any component of LTE architecture 200 or jitter buffer implementation 300), and may comprise one or more physical and/or logical partitions. Jitter buffer implementation 300 and each component included therein may include functionality and connectivity beyond what is shown in FIG. 3, as would be apparent to persons skilled in relevant art(s). However, such additional functionality is not shown in FIG. 3 for the sake of brevity.

As shown in FIG. 3, first turbo decoder 214 decodes channel data to generate hard bits (if the channel data is properly decoded, i.e., passes decode) which are transmitted to jitter buffer 256. Jitter buffer 256 may provide stored hard bits to AMR 218 and/or to memory 270. As shown in FIG. 3, the position of frame n in jitter buffer 256 is referred to as the "play-out position" (i.e., the position in jitter buffer 256 from which hard bits are transmitted to AMR 218 for speech decoding, also referred to as the ultimate position). First turbo decoder 214 also generates soft bits from the channel data and transmits the soft bits to APL layer 212. The soft bits are transmitted to JSCD block 216 if properly decoded (i.e., pass), and are transmitted to secondary jitter buffer 302 if not properly decoded (i.e., fail). The determination of whether the soft bits are associated with proper or improper channel decoding may be made by turbo decoder 214, by JSCD block 216, or by logic/circuitry not shown for the sake of brevity.

In some embodiments, first turbo decoder 214 may transmit generated soft bits to an optional JSCD block 304. Optional JSCD block 304 may be configured similarly to JSCD block 216, in embodiments. Optional JSCD block 304 may decode channel data in the form of the received soft bits, and if properly decoded (i.e., pass), optional JSCD block 304 transmits hard bits to jitter buffer 256. If not properly decoded (i.e., fail), optional JSCD block 304 transmits resulting soft bits to secondary jitter buffer 302.

The soft bits transmitted to secondary jitter buffer 302 are buffered or stored for use by JSCD block 216. Accordingly, secondary jitter buffer 302 is configured to store a plurality of soft bits corresponding to one or more subsets of soft bits, each being associated with a frame. In embodiments, JSCD block 216 may take one or more of the stored subsets as inputs to perform JSCD on one or more of the stored subsets to generate corresponding hard bits. It should be noted that even though subsets of soft bits stored in secondary jitter buffer 302 are associated with frames that were decoded with errors, neighboring frames may be significantly correlated and their use in JSCD provides an increased potential for proper channel decoding. JSCD block 216 may also take hard bits stored in jitter buffer 256, including future frames, as well as past frame information and/or hard bits/information stored in memory 270 as inputs to perform JSCD on the one or more subsets of soft bits stored in secondary jitter buffer 302. As shown in FIG. 3 and according to embodiments, a delayed jitter buffer approach is implemented. JSCD block 216 may wait (or be delayed) in performing JSCD on a subset of soft bits associated with a frame that was improperly channel decoded until the frame position immediately precedes the play-out position (i.e., when the frame position corresponds to the penultimate position in jitter buffer 256). By waiting to perform JSCD, additional frames may arrive prior to performing channel decoding, and thus provide additional information that may be used during JSCD to increase efficacy (e.g., allowing for significantly better prediction of values by exploiting information in future frames and additional past frames). In embodiments, the delayed jitter buffer approach may be extended to include an iterative mechanism in which JSCD is performed for one or more subsets of soft bits associated with frames that were improperly channel decoded as each of the frames traverse each position in jitter buffer 256. Each approach is discussed in detail below.

In the embodiment shown, hard bits from first turbo decoder 214 or optional JSCD block 304 that are buffered/stored in jitter buffer 256 enter at position n+5 and traverse jitter buffer 256 to play-out position n. For instance, hard bits of the frame in position n+2 will be shifted (physically or logically) to position n+1 when hard bits of the frame at position n are played out to AMR 218. Hard bits from JSCD block 216 and out of order hard bits from first turbo decoder 214 or optional JSCD block 304 may enter at their corresponding position in jitter buffer 256. For example, when JSCD block 216 properly decodes soft bits corresponding to frame n+1 in secondary jitter buffer 302, the corresponding hard bits enter jitter buffer 256 at position n+1 (physically or logically). Jitter buffer 256 may be sized to buffer or store a plurality of hard bits that corresponds to one or more frames that have been properly channel decoded. For instance, as shown in FIG. 3, jitter buffer 256 is configured to store hard bits for six frames corresponding to the current play-out position at time n, as well as at time n+1, time n+2, time n+3, time n+4, and time n+5. Times greater than n, e.g., n+1, n+2, etc., denote future frame times as referred to herein. It is contemplated that jitter buffer 256 may be configured to store hard bits for more or fewer frames, and/or may dynamically change in size. As shown, hard bits associated with frame n (at the current play-out position, i.e., at the ultimate position of jitter buffer 256) and frame n+2 are stored in jitter buffer 256. In the depicted embodiment, frames n+1, n+3, n+4, and n+5 do not have corresponding hard bits stored in jitter buffer 256, but are shown in parentheses "( )" for illustration of their place in the frame sequence. Frames n+1, n+3, and n+5 are denoted with asterisks "*" to illustrate these frames have not been properly decoded, and frame n+4 is denoted with a caret "^" to illustrate an out of order frame that has not yet arrived.

In the embodiment shown, soft bits from first turbo decoder 214 or optional JSCD block 304 that are buffered/stored in secondary jitter buffer 302 enter at position occupied by soft bits of frame n+5 and traverse secondary jitter buffer 302 to the position occupied by soft bits of frame n+1. The buffered/stored soft bits may be arranged sequentially and/or chronologically by physical and/or logical organization. For instance, soft bits of the frame in position n+3 will be shifted (physically or logically) to position occupied by frame n+1 when soft bits of the frame at position n+1 successfully decoded by JSCD block 216. Out of order soft bits from first turbo decoder 214 or optional JSCD block 304 may enter secondary jitter buffer 302 at their respective sequential positions. Secondary jitter buffer 302 may be sized to buffer/store one or more subsets of soft bits associated frames that have not been properly decoded. For example, secondary jitter buffer 302 as shown stores three subsets of soft bits corresponding to three frames n+1, n+3, and n+5. It is contemplated that secondary jitter buffer 302 may be configured to store soft bits for more of fewer frames, and/or may dynamically change in size.

In various embodiments, JSCD block 216 may perform JSCD at a position other than the penultimate position in jitter buffer 256. It should also be noted that in various embodiments, the soft bits stored in secondary jitter buffer 302 and/or the hard bits stored in memory 270 may be stored in jitter buffer 256. Jitter buffer 256 may comprise one or more physical partitions and/or one or more logical partitions according to the embodiments described herein. In such embodiments, frame position n may still be considered the play-out position or the ultimate position even though additional hard bits of past frames may be stored in jitter buffer 256.

Exemplary jitter buffer enhanced JSCD operations will now be described.

A. Example Embodiments for Delayed Jitter Buffer Enhanced Joint Source Channel Decoding As described above and shown FIG. 3, frames n+1, n+3, and n+5 contain soft bits associated with frames that have not been properly decoded, e.g., by first turbo decoder 214. JSCD block 216 is configured to perform JSCD on the soft bits associated with the frame corresponding to the penultimate position in jitter buffer 256. As shown, the soft bits of frame n+1 are stored in the ultimate position of secondary jitter buffer 302, and frame n+1 corresponds to the penultimate position in jitter buffer 256. Accordingly, JSCD block 216 takes the soft bits associated with frame n+1 as inputs and performs JSCD. Additionally, and as illustrated in FIG. 3, one or more additional subsets of soft bits in secondary jitter buffer 302, one or more subsets of hard bits in jitter buffer 256, and/or one or more subsets of hard bits in memory 270 may be taken as additional inputs by JSCD block 216 to perform JSCD on the soft bits associated with frame n+1. In embodiments, a parameter correlation between certain packet header fields or certain encoded speech parameters associated with the additional inputs and the soft bits associated with frame n+1 may be utilized by JSCD block 216 in performing the JSCD. It is contemplated that one or more parameters described herein, alone or in various combinations, may be utilized to perform JSCD in accordance with the present techniques and embodiments, such as, but without limitation, parameters described below in Sections 7 and 8 (e.g., pitch, Line Spectral Pairs (LSPs), pitch gain, fixed codebook gain, packet sequence numbers, etc.). Using delayed jitter buffer enhanced JSCD, channel decoding of soft bits (e.g., for frame n+1) may exploit contents/information of frames with soft bits stored in secondary jitter buffer 302, as well as contents/information in jitter buffer 256 (e.g., past frame n and/or future frame n+2) and/or memory 270 from frames that were properly channel decoded (e.g., frames n−3, n−2, and/or n−1).

Frame n+4, as described above, is out of order and has not yet arrived for channel decoding. When out of order frame n+4 arrives for channel decoding, hard bits associated with this frame are stored in jitter buffer 256 if the frame is properly channel decoded by first turbo decoder 214 or optional JSCD block 304, as generally described above. If not properly channel decoded, soft bits associated with this frame are stored in secondary jitter buffer 302 and JSCD is performed by JSCD block 216, as generally described above. However, unlike prior solutions that utilize jitter buffers, delayed jitter buffer enhanced JSCD allows utilization of soft bits stored in secondary jitter buffer 302 as well as other frame information stored in jitter buffer 256 (including future frames) to perform JSCD on soft bits associated with out of order frames. For instance, in an example where JSCD block 216 properly decodes frames n+1, n+3, and n+5 and frame n+4 has just arrived, delayed jitter buffer enhanced JSCD allows JSCD block 216 to utilize information (e.g., hard bits) associated with each frame that is stored in jitter buffer 256 (including future frame n+5) to perform channel decoding for soft bits of frame n+4 if this frame was previously improperly channel decoded. Prior solutions have not exploited hard bits stored in a jitter buffer, especially for future frames, to perform JSCD on out of order packets.

B. Example Embodiments for Iterative Jitter Buffer Enhanced Joint Source Channel Decoding In embodiments, the delayed jitter buffer approach may be extended to include an iterative mechanism in which JSCD is performed for one or more subsets of soft bits associated with frames that were improperly channel decoded as each of the frames traverse each position in jitter buffer 256. Frames that have arrived and been channel decoded with errors in advance of the play-out position shown in jitter buffer 256 may each be channel decoded using JSCD by JSCD block 216 at each time position of jitter buffer 256, not just at the penultimate position preceding the play-out position, using the past and future information (e.g., hard bits, soft bits, PDFs, etc.) available to it at that time. In the case of the above-described embodiments related to FIG. 3, during an earlier frame pass, frame n+4 may be correctly decoded, in which case frame n+4 is available for channel decoding of frame n+3 before it reaches the play-out position or penultimate position. In this way, packets that have arrived may be maximally exploited by the JSCD at every frame time.

6. Example Embodiments for Jitter Buffer Enhanced Joint Source Channel Decoding Using Parameter Domain Correlation Jitter buffer enhanced Joint Source Channel Decoding (JSCD) may be performed in accordance with the embodiments described above. In accordance with embodiments described in this section, jitter buffer enhanced JSCD is performed using correlation of parameters within and associated with the data to improve decoding. Correlation in the parameter domain is used to generate models (e.g., probability density functions (PDFs)) for parameters and/or parameter combinations. These models are then applied to update the soft bit values obtained for each parameter during channel decoding.

Sources of redundancy in Voice over LTE (VoLTE) data packets may be generally described as follows. A residual redundancy incurred by encoding $\rho_T$ may be shown as:

$$\rho_T = R - H_x \quad (1)$$

where R represents an encoding rate (in bits/symbol), and where $H_x$ represents the minimum rate (in bits/symbol) at which the process can be encoded without incurring distortion. For redundancy in the AMR-NB (Adaptive Multi-Rate Narrowband) speech codec used in VoLTE, a stationary, first-order Markov chain may provide a probabilistic model. The total redundancy may be broken into two terms:

$$\rho_T = \rho_D + \rho_M \quad (2)$$

where $\rho_D$ represents redundancy due to the non-uniform distribution of the parameter, and where $\rho_M$ represents redundancy due to the parameter correlation in consecutive frames.

Parameters that may be exploited for correlation purposes may include, but are not limited to, speech coding parameters and packet header parameters. The concept of parameter correlation, however, is generally applicable to any multi-bit source parameter. The correlations may be between two or more parameters and may be between parameters of a current frame, or between one or more parameters of a current frame and one or more parameters of a past or future frame.

Parameter domain correlation and probabilities are now described in further detail. Correlation in the parameter domain may be described in terms of probabilities and log likelihood ratios (LLRs) (e.g., soft bits), as noted above. For example, as referenced herein, the vector term $\underline{x}_0 = \{x_0(0), x_0(1)\}, \ldots, x_0(M-1)$ is the M-bit coded representation of a parameter with $x_0(m) \in \{0,1\}, m=0,1, \ldots, M-1$. Hence, there are $2^M$ such vectors with $\underline{x}_0^i$ being the $i^{th}$ vector. The complete received vector of indices for the last frame is denoted by $\hat{\underline{Y}}_{-1}$, and all bit locations except the $m^{th}$ bit in $\underline{x}_0$ is denoted by $\underline{x}_0 \backslash m$. To find the probability that the transmitted vector was $\underline{x}_0^i$, the past history of received indices is used (e.g., one or more previous frames may be used) along with all bit locations within $\underline{x}_0$ except the bit for which the bit probability is currently determining, hence $\underline{x}_0 \backslash m$. Assuming only the previous frame is used for illustrative simplicity, the probability that the transmitted vector (parameter representation) was $\underline{x}_0^i$ considering the $m^{th}$ bit is given by:

$$P_m(\underline{x}_0^i | \hat{\underline{Y}}_{-1}, \underline{x}_0 \backslash m) = \frac{P(\underline{x}_0^i | \hat{\underline{Y}}_{-1}) \cdot P_m(\underline{x}_0^i | \underline{x}_0 \backslash m)}{\sum_{j=0}^{2^{M-1}} P_m(\underline{x}_0^j | \hat{\underline{Y}}_{-1}) \cdot P_m(\underline{x}_0^j | \underline{x}_0 \backslash m)}. \quad (3)$$

The probability shown by Equation 3 is computed for each possible value of the vector (i.e., the parameter representation) for each bit m of the M bits in the vector. For a given parameter having M bits, Equation 3 is performed $2^M/\times$ M times to determine the probability of each possible vector value when considering each bit in the vector. Once the probability of each index $\underline{x}_0^i$ is computed, the probability for the $m^{th}$ bit is then simply the sum of the probabilities of each index $\underline{x}_0^i$ for which the $m^{th}$ bit is equal to $x_0(m)$:

$$P_p(x_0(m)|\hat{\underline{Y}}_{-1},\underline{x}_0) = \Sigma_{\{i|x_0(m)=\underline{x}_0^i(m)\}} P_m(\underline{x}_0^i|\hat{\underline{Y}}_{-1},\underline{x}_0\backslash m), \quad (4)$$

as described in further detail in an exemplary embodiment below.

In embodiments, information received not only in the previous frame, $\hat{\underline{Y}}_{-1}$, but also in even older frames, future frames, and the current frame, may also be exploited. This is denoted simply by $\hat{\underline{Y}}$. The a-priori probability density function (PDF), $P(\underline{x}_0^i|\hat{\underline{Y}})$, may be assumed, in one approach, as a Markov-0 model. This may be appropriate if there is no correlation between the parameter of interest and any current or previously received parameters. The a-priori PDF may also be used to weight and/or offset probabilities associated with data in the current frame, as shown in Equation 3 above. In this case, $$P(\underline{x}_0^i|\hat{\underline{Y}}) = P(\underline{x}_0^i). \quad (5)$$

The PDF, $P(\underline{x}_0^i)$, is obtained by training over a large speech database to determine the probability of occurrence of each index. Such a PDF may be referred to as a reference PDF or reference data. Often, a parameter may have a different distribution (PDF) depending on the speech type, e.g., voiced or non-voiced speech. In these cases, different PDFs for each speech type may be used.

In embodiments, a conditional PDF may be used based on parameters received in previous or future frames. A parameter index that was decoded in a previous frame may be represented by $\underline{z}^j$, and may be the same or a different parameter than x. If J total parameters are used, then $$P(x_0^i|\hat{\underline{Y}}) = P(x_0^i|\hat{\underline{Y}}_{-1}) \quad (6)$$
$$= P(x_0^i|\underline{z}_-^1, \underline{z}_-^2, \ldots, \underline{z}_-^J)$$
$$= \sum_{n1=0}^{N1-1} \sum_{n2=0}^{N2-1} \cdots \sum_{nJ=0}^{NJ-1} P(\underline{x}_0 = i | \underline{z}_-^1 = \underline{n1},$$
$$\underline{z}_-^2 = \underline{n2} \ldots, \underline{z}_-^J = \underline{nJ}) \cdot$$
$$P(\underline{z}_-^1 = \underline{n1}, \underline{z}_-^2 = \underline{n2} \ldots, \underline{z}_-^J = \underline{nJ}).$$

If the solution is constrained to use only previous frames and/or future frames parameters when those frames were correctly decoded, then the value of the $\underline{z}^j$'s are known, and Equation 6 may be simplified to:

$$P(\underline{x}_0^i|\hat{\underline{Y}}) = P(\underline{x}_0 = i | \underline{z}_-^1 = n1, \underline{z}_-^2 = n2 \ldots, \underline{z}_-^J = nJ). \quad (7)$$

The above can be extended to include parameters in the current frame. However, in that case, simplification (as in Equation 7) may not be possible because the current frame is still being decoded, and it is not yet known if errors exist.

Referring again to FIG. 2, parameter correlation is utilized in a first PRAB sub-block and in second PRAB sub-block of PRAB(s) 264 to generate conditional probabilities, according to embodiments (e.g., as described above in Section 4). In embodiments where a value $x_k$ represents a data bit, and where y' represents one or more received data bits and corresponding parity bits, the soft bits (LLRs) generated by a first MAP decoder may be represented by $L_{map}^{d1s2}(x_k)$, and the soft bits (LLRs) generated by a second MAP decoder may be represented by $L_{map}^{d2s1}(x_k)$. The extrinsic information computed by a first PRAB sub-block may be represented by $L_e^{s1}(x_k)$, and the extrinsic information computed by a second PRAB sub-block may be represented by $L_e^{s2}(x_k)$. Thus, the soft bits (LLR information) input to the first PRAB sub-block may be shown as:

$$L_{map}^{d1}(x_k) = L_{map}^{d1s2}(x_k) - L_e^{s2}(x_k) \quad (8)$$

and the soft bits (LLR information) input into the second PRAB sub-block may be shown as:

$$L_{map}^{d2}(x_k) = L_{map}^{d2s1}(x_k) - L_e^{s1}(x_k) \quad (9)$$

This soft bit LLR information is used by the first and second PRAB sub-blocks along with the a-priori knowledge to derive the prediction probabilities $P_p$ (as described above in this section) from which the predicted log likelihood ratios are computed:

$$L_e^{si}(x_k) = \log\left[\frac{P_p(x_k = 1 | y')}{P_p(x_k = 0 | y')}\right] i = 1, 2, \quad (10)$$

where $P_p$ is a probability that may be obtained by incorporating intra-frame and/or inter-frame a-priori knowledge.

The next section describes jitter buffer enhanced JSCD embodiments, with respect to jitter buffer implementation 300 and JSCD block 216 as described above, in which parameter domain correlation of speech information is utilized to improve channel decoding.

7. Example Jitter Buffer Enhanced Joint Source Channel Decoding Embodiments that Exploit Speech Coding Parameter Correlation An A-priori Speech Statistics Algorithm (ASSA) is now described that uses a-priori speech information to facilitate jitter buffer enhanced joint source channel decoding (JSCD). In particular, the correlation of certain source-encoded speech parameters is used to facilitate joint source channel decoding. For the AMR-NB (Adaptive Multi-Rate Narrowband) speech codec used in VoLTE (Voice over LTE), the parameters that may be focused on include, but are not limited to, pitch, Line Spectral Pairs (LSPs), pitch gain, and fixed codebook gain. Models (e.g., conditional probability density functions (PDFs)) are obtained for each of the parameters and are applied to update the soft bit values that are obtained for each parameter during channel decoding (turbo decoding in VoLTE). The models applied may vary depending upon whether the speech is classified as voiced or unvoiced, transition, or background noise. For example, in the case of an AMR-NB speech codec operating at 12.2 Kb/s, voiced speech may include up to 23 bits, or more, of total signal redundancy, and unvoiced speech may include up to 16 bits, or more, of total signal redundancy. However, frame classification based on only past speech and the currently decoded frame may be difficult, especially during speech transitions (voiced to unvoiced, etc.). This is because the current frame may contain errors. For example, a large change in the pitch period may be due to bit errors in the current frame, or may be due to a transition from voiced to unvoiced speech. If a future frame is known, this provides significant insight into the classification of the current frame. Continuing with the pitch period example, if a future frame has been decoded without errors and the pitch period is close to that in the previous frame, then a large change in the current frame is more likely to be due to bit errors. However, if the pitch period in the future frame also has a large delta compared to the previous frame, then this suggests that the current frame may be a transitional frame and low correlation with the previous pitch is more likely. Similar improvements can be made for the spectrum (e.g., LSPs) and the gain. Combined together, a very reliable frame classification can be made that can then be used to both train separate PDFs based on these classifications, and then select the appropriate PDFs during the decoding process. For example, separate PDFs for the pitch could be used for voiced, unvoiced, and transitional frames.

Speech redundancy may be utilized with the parameter-based probability equations noted in the previous section (e.g., Equations 3, 6, and 7). To apply parameter based probability, one or more a-priori probability density functions (PDFs) are generated based on known speech data. For example, the probability of a given vector (e.g., parameter) based on a given frame (e.g., a previous or future frame) may be shown as:

$$P(\underline{x}_0^i | \hat{\underline{Y}}_{-1}) \text{ or more generally, } P(\underline{x}_0^i | \hat{\underline{Y}}), \quad (11)$$

as noted above. Generated a-priori PDFs may be stored in a memory, e.g., memory 270, for use in decoding. In embodiments, the ASSA may be utilized with any given speech coding parameter, such as, but not limited to, pitch, line spectral pairs (LSPs), pitch gain, fixed codebook gain, etc.

Pitch and pitch period are now described in detail. The pitch distribution for voiced and unvoiced speech is significantly different. To better exploit the pitch redundancy, a voiced/unvoiced classifier is employed at the joint source channel decoder (e.g., JSCD block 216), and separate PDFs are used for each classification.

The correlation of pitch parameters may be performed with respect to the pitch in sub-frames of a given frame, past frames, and/or future frames. For voiced speech, the pitch is highly correlated in time. To exploit this, the pitch for the current sub-frame is predicted based on the pitch history. The probability density function (PDF) of the difference between the index of the quantized predicted pitch and the index of the actual pitch is obtained over a large database offline. Then during online processing, the PDF is centered about the index of the quantized predicted pitch to obtain the term $P(\underline{x}_0^i | \hat{\underline{Y}}_{-1})$. The performance of this approach is dependent upon the accuracy of the predicted pitch. Having a future frame available would greatly improve accuracy. For example, in the case where the previous and future frames are correctly decoded, the pitch can be obtained through interpolation. In addition, processing and/or logic may be implemented in the case of pitch halving/doubling. In one approach to interpolation for the case of an AMR 12.2 codec with four sub-frame pitch values, the decoded pitch in the $4^{th}$ sub-frame of the last frame, $p_4(n-1)$, and the pitch in the $1^{st}$ sub-frame of the future frame, $p_1(n+1)$, are used to predict the pitch in the current frame:

$$\hat{p}_i(n) = p_4(n-1) + 0.2 \cdot i \cdot (p_1(n+1) - p_4(n-1)), \text{ where } i = 1 \ldots 4. \quad (12)$$

In the case where the current frame is classified as a transitional frame, care must be taken in the pitch prediction. In general, the predicted pitch should be set to the pitch of the neighboring frame that was classified as voiced speech. In the case that frame n+1 is classified as voiced:

$$\hat{p}_i(n) = p_1(n+1), \text{ where } i = 1 \ldots 4. \quad (13)$$

In the case that frame n−1 is classified as voiced:

$$\hat{p}_i(n) = p_4(n-1), \text{ where } i = 1 \ldots 4. \quad (14)$$

Alternatively, a joint PDF approach may be used. The index of the quantized pitch in $p_4(n-1)$ and $p_1(n+1)$ may be used to index the joint PDF.

LSPs are next described in detail. Generally speaking, LSPs provide a representation of the spectrum of speech on a frame by frame basis. LSPs are derived from the linear prediction coefficients (LPCs) and are used in place of LPCs because they have better quantization properties. The LSPs are highly correlated with neighboring frames and thus also benefit from having future frame information. Several approaches may be used to exploit this. In one approach, a joint PDF may be used. In this case, the indices representing the LSPs in the previous frame and the future frame may be used in the joint PDF and be based on the quantization scheme of the LSP vector.

Alternatively, the LSP vector in the current frame may be predicted from the past and/or future frames. The manner in which the future frame is used in the prediction is dependent upon the quantization scheme used. In the case of an AMR 12.2 codec, a 1st order moving average prediction is used where the decoded LSPs in the future frame are dependent on the quantization residual of the current frame, however several approaches are possible. In one approach, the prediction residual is interpolated instead of the LSPs themselves. In another approach, the previous frame is used to predict the value of the LSPs in the current frame from which the estimated prediction residual can be derived. This estimated residual for the current frame is then used to decode the LSPs in the future frame. Interpolation is then performed in the LSP domain to obtain an estimate of the LSPs in the current frame. Still other approaches may also be used.

It should be noted that if there are too many error frames in the history buffer, the predicted LSP vectors may be unreliable. In this case, the PDF of the codebook indices is used directly. Using the PDF of the codebook indices does not exploit the temporal redundancy remaining in the indices after moving average prediction, but provides better performance in high packet loss rate conditions. In either case, separate PDFs are used for voiced and unvoiced speech.

Pitch gain is next described in detail. Pitch gain is highly correlated from frame to frame. A joint PDF approach may also be used to exploit the correlation with neighboring sub-frames. However, within the current frame, bit-errors may be present due to the fact that the turbo decoder has yet to converge. If a future frame has been decoded correctly, better performance may be achieved by using the error-free index of the first sub-frame of the future frame instead. Alternatively, an interpolation scheme similar to that used for the pitch could be used, as described above. The pitch gain is predicted based on the past and future frame. The PDF of the index error between the actual pitch gain and the quantized predicted pitch gain may be used. Separate PDFs are used for voiced and unvoiced speech.

The fixed codebook gain is also highly correlated from frame to frame. Similar approaches to those listed above can be used, with the exact approach dependent on the quantization scheme used for the gain.

The next section describes jitter buffer enhanced JSCD embodiments, with respect to jitter buffer implementation 300 and JSCD block 216 as described above, in which parameter domain correlation of packet headers is utilized to improve channel decoding.

8. Example Jitter Buffer Enhanced Joint Source Channel Decoding Embodiments that Exploit Packet Field Redundancy A Packet Header Statistics Algorithm (PHSA) is described that uses a priori knowledge of a protocol stack (e.g., the LTE protocol stack) to facilitate joint source channel decoding. Models of each protocol layer are developed which predict the values of the headers in future frames. In particular, models (e.g., probability density functions (PDFs)) are obtained for certain header elements and are applied to update the soft bit values that are obtained for each element as part of a joint source channel decoding process. Because of the significant redundancy introduced in the headers by the protocol stack, the PHSA used in conjunction with a joint source channel turbo decoder provides significant improvement in decoding performance. It should be noted that while the PHSA is described in terms of "packet headers" and "packet header redundancy," other packet fields may be utilized with the PHSA embodiments described herein. As such, the term "packet field redundancy" may be used interchangeably with "packet header redundancy." It should also be noted that at lower operating rates, the percentage of signal redundancy with respect to packet headers increases, thus offering even greater benefits.

Packet header redundancy may be utilized with the parameter-based probability equations noted in the sections above (e.g., Equations 3, 6, and 7). To apply parameter based probability, one or more a-priori probability density functions (PDFs) are generated based on known and/or previous header information. For example, the probability of a given vector (e.g., header field) based on a given frame (e.g., a previous or a future frame) may be shown using Equation 11:

$$P(\underline{x}_0^i | \underline{\hat{Y}}_{-1}) \text{ or more generally, } P(\underline{x}_0^i | \underline{\hat{Y}}), \quad (11)$$

as noted above. Generated a-priori PDFs may be stored in a memory (e.g., memory 270) for use in decoding. In embodiments, the PHSA may be utilized with any packet header parameters, such as headers associated with, but not limited to, a MAC layer, an RLC layer, a PDCP layer, and an RoHC layer, as well as an RTP payload, transport block padding, and/or the like. Examples of redundancy in these parameters are discussed below.

The availability of future frames increases the benefits described above. For example, network layers in the LTE protocol stack may contain a sequence number. The PDF of a sequence number can be derived from observing the sequence number of arriving packets. The availability of future packets can be used in computing the associated likelihoods. Assume the PDF indicates that the probability that a packet arrives out of sequence by one packet is 1%, and the probability that it arrives out of sequence by two packets is 0.1%, and the probability that it arrives out of sequence by more than two packets is 0.0%. If no future frames are available, then the probability that the current packet n is in sequence is 98.9%. However, if packet n+1 is in the jitter buffer (e.g., jitter buffer 256) or soft bits associated with packet n+1 are in a second jitter buffer (e.g., secondary jitter buffer 302), the probability that the current packet is in sequence may be 99.9%.

In some embodiments, the probability of a packet arriving out of sequence by 'n' packets (where n=$-N_1$, $-N_1+1$, $-N_1+2$, ..., 0, 1, 2, ..., $N_2$) is determined by observing the past history of received packets which were correctly decoded. This can be done in a number of ways. For example, a sliding window of length 'M' packets can be used. The number of times a packet arrives out of sequence by n is maintained. If $n_i$ is the number observed in the last M packets for when n='i', then the probability that the packet is out of sequence by I packets is given by $n_i/M$ ($n_i$ divided by M). In some embodiments, a running average approach can be used with a forgetting factor $\alpha$. The probability of each n is initialized to an estimate, which may be predefined or determined on a case-by-case basis. If it is observed that the last packet arrived out of sequence by 'j' packets, then if the probability estimate of n=i at time 't' is denoted $P(n=i)_t$, the probabilities are updated by:

$$P(n=j)_{t+1} = [P(n=j)_t \times \alpha] + [1-\alpha] \quad (15), \text{ and}$$

$$P(n=i)_{t+1} = P(n=i)_t \times \alpha, \text{ for } i \neq j. \quad (16)$$

In either method, the value of M or a can be determined or adjusted based on the expected network conditions. It is contemplated that other methods can be used to estimate the probabilities and will be equally applicable to the embodiments and techniques described herein.

Next, the PDF for each possible sequence number is obtained. If the last sequence number SN(t)=sn, and the sequence number is of length 'B' bits, then:

$$P(SN(t+1)=(sn+1+v)\%B)=P(n=v)_{t+1}, \quad (17)$$

where 'v' is the number of packets by which sn is out of order and where '%' denotes the modulus operator. Once the PDF is built according to Equation 17, the determination of probabilities described above with respect to Equations 3 and 4 may be used. Generally speaking, the approach described with respect to Equations 15, 16, and 17 can be extended to monitoring received bits, estimating their probabilities, and applying this a-priori knowledge to improve channel decoding.

The RLC header includes a five-bit sequence number. The sequence number increments by one in each subsequent packet. The starting value of the sequence number can be obtained by observing the sequence number in the first correctly received packet while setting the corresponding bit probabilities to 0.5. After obtaining the sequence number, the sequence number for the next packet is predicted by incrementing the value by 1. Because of the possibility of duplicate and out-of-sequence packets, the LSBs of the sequence number are less predictable than the MSBs. The probabilities can be obtained based on the past history of received packets. A "forgetting factor" is used to ensure that the statistics adapt to changing network behavior.

The PDCP header includes a seven-bit sequence number. The sequence number increments by one in each subsequent packet. The PDCP header sequence number may be treated similarly to the RLC header sequence number described above.

A four-bit codec mode request (CMR) field occupies the four MSBs of the RTP payload. Changes in CMR values are infrequent. In one embodiment, prior and/or future CMR values are used to predict the current CMR value. Because a change in CMR is unpredictable, the probabilities would have to be reduced substantially to correctly decode a packet with a change in CMR, but this would dramatically reduce the improvement obtained from the correct CMR prediction for the vast majority of the frames. To help alleviate this concern, a tradeoff may be made in which the possible values of the CMR field can be reduced by considering the negotiated codec mode set that is determined during call setup, as specified in IR.92. Thus, in one embodiment, probabilities may be increased while still allowing for properly decoded packets.

A six-bit table of contents (ToC) field occupies the next six MSBs of the RTP payload. The ToC filed may be handled similarly to the CMR field.

Additional considerations are contemplated for parameters that correspond to sequence numbers. That is, PRAB elements (e.g., PRAB sub-blocks) may contain logic and/or decision blocks/modules to improve correlation of sequence numbers such as the "forgetting factor" described herein. It is contemplated that for instances of sequence number "roll over," especially concerning the most significant bits in the value, the embodiments described herein account for such possibilities to enable proper parameter domain correlation.

The next section describes further example embodiments and advantages for jitter buffer enhanced joint source channel decoding.

9. Further Example Embodiments and Advantages for Jitter Buffer Enhanced Joint Source Channel Decoding The embodiments described herein enable jitter buffer enhanced JSCD. Jitter buffer enhanced JSCD may be further extended to use parameter domain correlation. Embodiments provide delayed and iterative jitter buffer approaches to improve channel decoding. It is contemplated, however, that the jitter buffer enhanced JSCD embodiments described may be applicable to decoding strategies and implementations other than those explicitly set forth herein. For example, decoders in addition to turbo decoders may be used to exploit the benefits of jitter buffer enhanced decoding. Likewise, other jitter buffer implementations may be used to improve jitter buffer enhanced JSCD. For example and without limitation, additional jitter buffers may be used, different jitter buffer partitioning may be used, additional channel decoders may be used, etc. Further, protocols other than LTE and VoLTE may also benefit from jitter buffer enhanced JSCD as described above. Still further, alternative probability determination strategies are also contemplated as being applicable in jitter buffer enhanced JSCD implementations.

It will be recognized that the systems, their respective components, and/or the techniques described herein may be implemented in hardware, software, firmware, or any combination thereof, and/or may be implemented as hardware logic/electrical circuitry. The disclosed technologies can be put into practice using software, firmware, and/or hardware implementations other than those described herein. Any software, firmware, and hardware implementations suitable for performing the functions described herein can be used, such as those described below.

10. Example Operational Embodiments

Figure 4A:
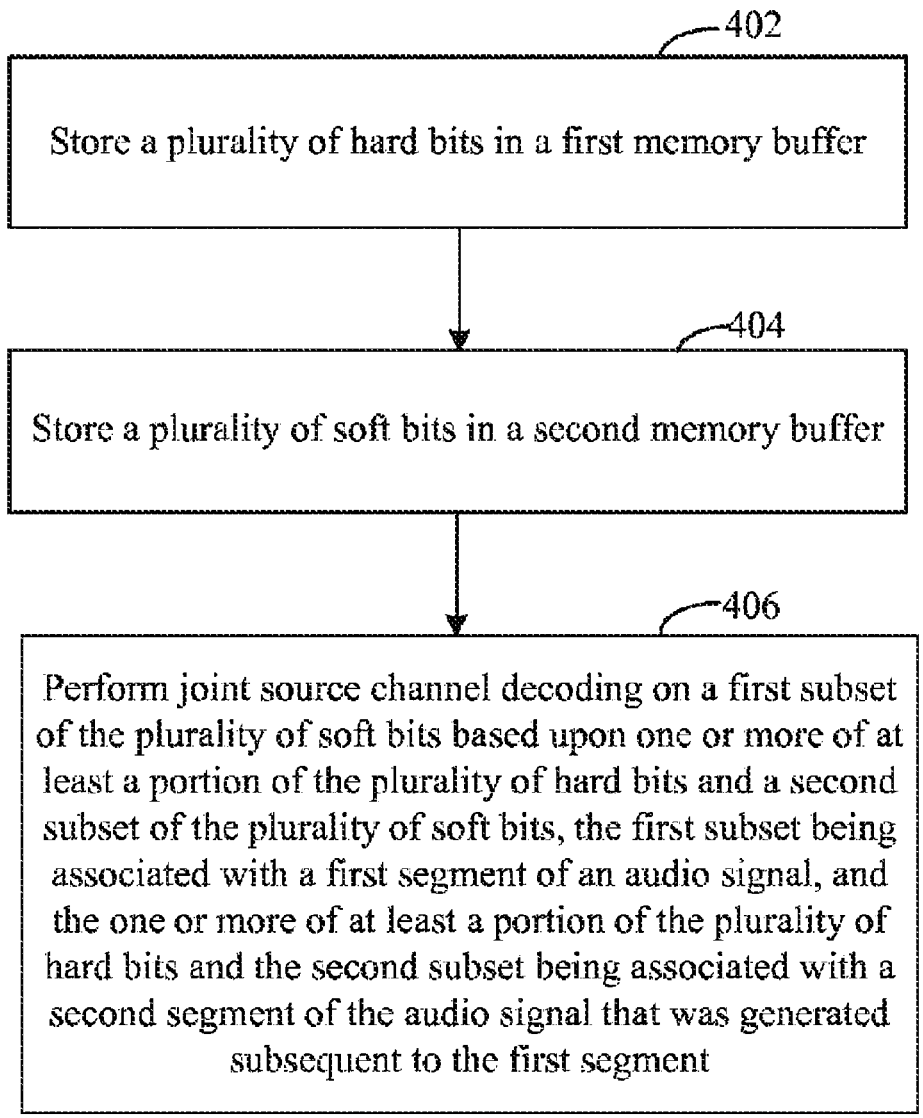
FIG. 4A is a flowchart providing example steps for performing jitter buffer enhanced joint source channel decoding, according to an exemplary embodiment.
Figure 6:
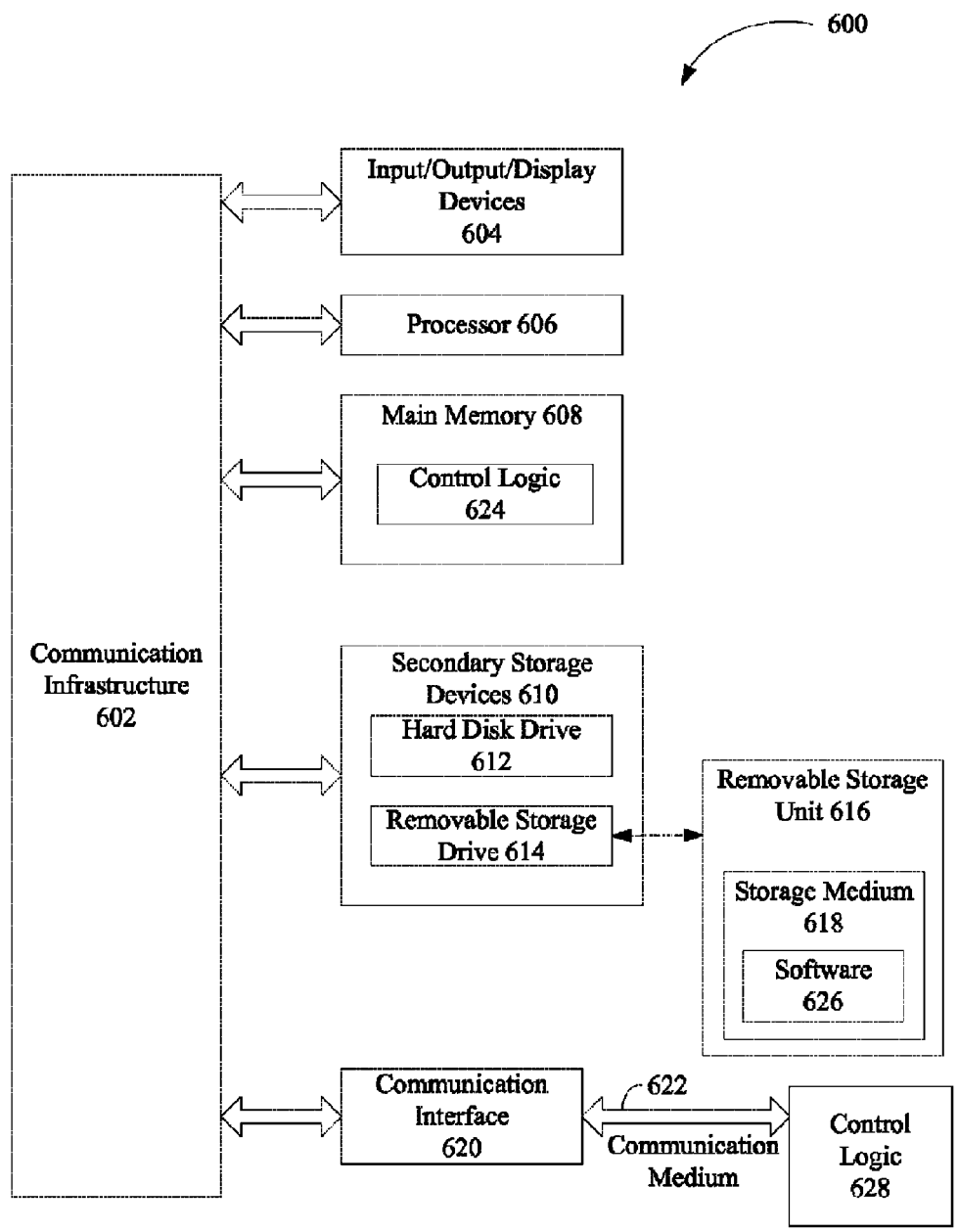
FIG. 6 is a block diagram of a computer system, according to an exemplary embodiment.

The embodiments described herein may perform their functions in various ways. For example, FIG. 4A shows a flowchart 400A providing example steps for jitter buffer enhanced JSCD, according to an exemplary embodiment. In one embodiment, flowchart 400A shows steps for delayed jitter buffer enhanced JSCD. LTE architecture 200 of FIG. 2, JSCD block 216 of FIGS. 2 & 3, jitter buffer implementation 300 of FIG. 3, computer 600 of FIG. 6, and/or any of their respective components/circuits may each operate according to flowchart 400A, in embodiments. Other structural and operational embodiments will be apparent to persons skilled in the relevant art(s) based on the discussion regarding flowchart 400A. Flowchart 400A is described as follows.

Flowchart 400A may begin with step 402. In step 402, a plurality of hard bits may be stored in a first memory buffer. The plurality of hard bits may be representative of one or more subsets of hard bits associated with properly channel decoded frames. Referring back to FIG. 3, jitter buffer 256 may receive and store a plurality of hard bits from first turbo decoder 214, optional JSCD block 304, and/or JSCD block 216.

In step 404, a plurality of soft bits may be stored in a second memory buffer. The plurality of soft bits may be representative of one or more subsets of soft bits associated with improperly channel decoded frames. Referring again to FIG. 3, secondary jitter buffer 256 may receive and store a plurality of soft bits from first turbo decoder 214 and/or optional JSCD block 304.

In step 406, joint source channel decoding may be performed on a first subset of the plurality of soft bits based upon one or more of at least a portion of the plurality of hard bits and a second subset of the plurality of soft bits. The first subset may be associated with a first segment of an audio signal, and the one or more of at least a portion of the plurality of hard bits and the second subset may be associated with a second segment of the audio signal that was generated subsequent to the first segment. For example, JSCD block 216 of FIG. 3 may receive the first subset, and at least a portion of the plurality of hard bits and/or a second subset of the plurality of soft bits, and use the received information to perform JSCD on the first subset.

In some example embodiments, one or more steps 402, 404, and/or 406 of flowchart 400A may not be performed. Moreover, steps in addition to or in lieu of steps 402, 404, and/or 406 may be performed. Further, in some example embodiments, one or more of steps 402, 404, and/or 406 may be performed out of order, in an alternate sequence, or partially (or completely) concurrently with other steps.

Figure 4B:
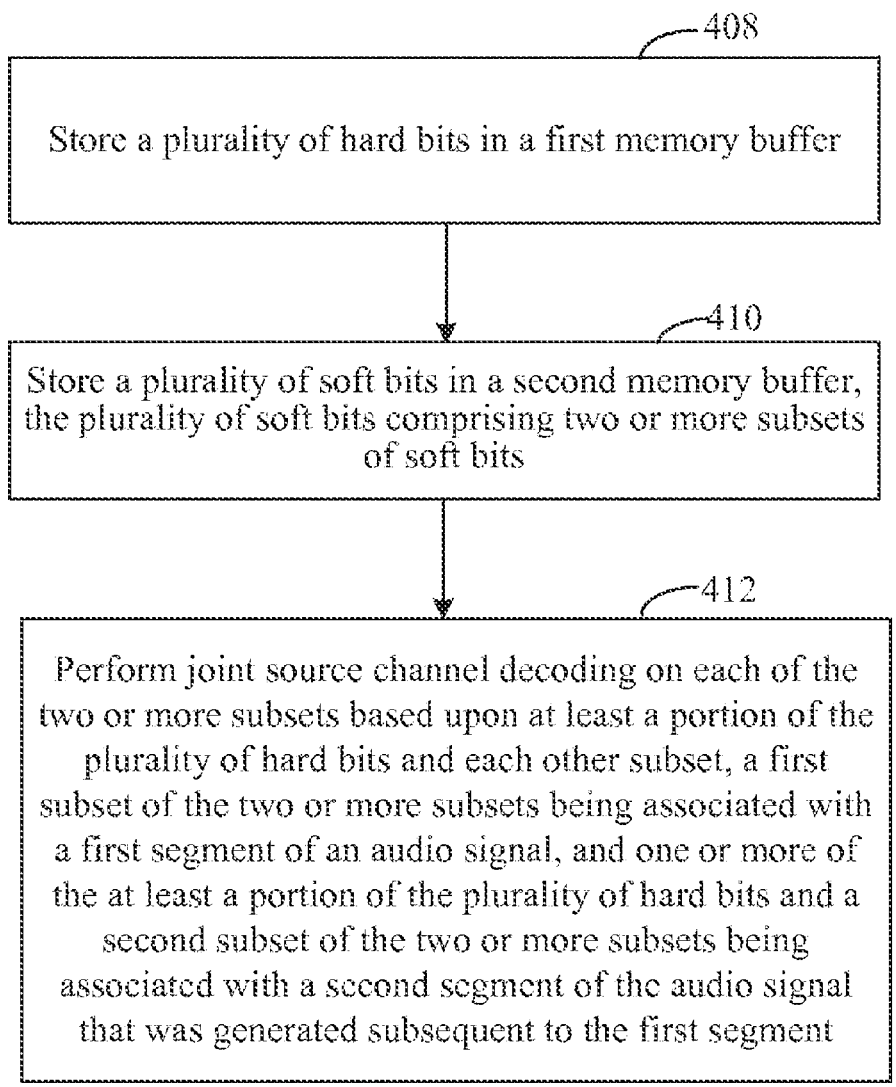
FIG. 4B is a flowchart providing example steps for performing jitter buffer enhanced joint source channel decoding, according to an exemplary embodiment.

FIG. 4B shows a flowchart 400B providing example steps for jitter buffer enhanced JSCD, according to an exemplary embodiment. In one embodiment, flowchart 400B shows steps for iterative jitter buffer enhanced JSCD. LTE architecture 200 of FIG. 2, JSCD block 216 of FIGS. 2 & 3, jitter buffer implementation 300 of FIG. 3, computer 600 of FIG. 6, and/or any of their respective components/circuits may each operate according to flowchart 400B, in embodiments. Other structural and operational embodiments will be apparent to persons skilled in the relevant art(s) based on the discussion regarding flowchart 400B. Flowchart 400B is described as follows.

Flowchart 400B may begin with step 408. In step 408, a plurality of hard bits may be stored in a first memory buffer. The plurality of hard bits may be representative of one or more subsets of hard bits associated with properly channel decoded frames. Referring back to FIG. 3, jitter buffer 256 may receive and store a plurality of hard bits from first turbo decoder 214, optional JSCD block 304, and/or JSCD block 216.

In step 410, a plurality of soft bits may be stored in a second memory buffer. The plurality of soft bits may comprises two or more subsets of soft bits. The plurality of soft bits may be representative of two or more subsets of soft bits associated with improperly channel decoded frames. Referring again to FIG. 3, secondary jitter buffer 256 may receive and store a plurality of soft bits from first turbo decoder 214 and/or optional JSCD block 304.

In step 412, joint source channel decoding may be performed on each of the two or more subsets based upon at least a portion of the plurality of hard bits and each other subset. The first subset of the two or more subsets may be associated with a first segment of an audio signal, and one or more of the at least a portion of the plurality of hard bits and a second subset of the two or more subsets may be associated with a second segment of the audio signal that was generated subsequent to the first segment. For example, JSCD block 216 of FIG. 3 may receive each subset, and at least a portion of the plurality of hard bits and each other subset, and use the received information to perform JSCD on each subset.

In some example embodiments, one or more steps 408, 410, and/or 412 of flowchart 400B may not be performed. Moreover, steps in addition to or in lieu of steps 408, 410, and/or 412 may be performed. Further, in some example embodiments, one or more of steps 408, 410, and/or 412 may be performed out of order, in an alternate sequence, or partially (or completely) concurrently with other steps.

Figure 5:
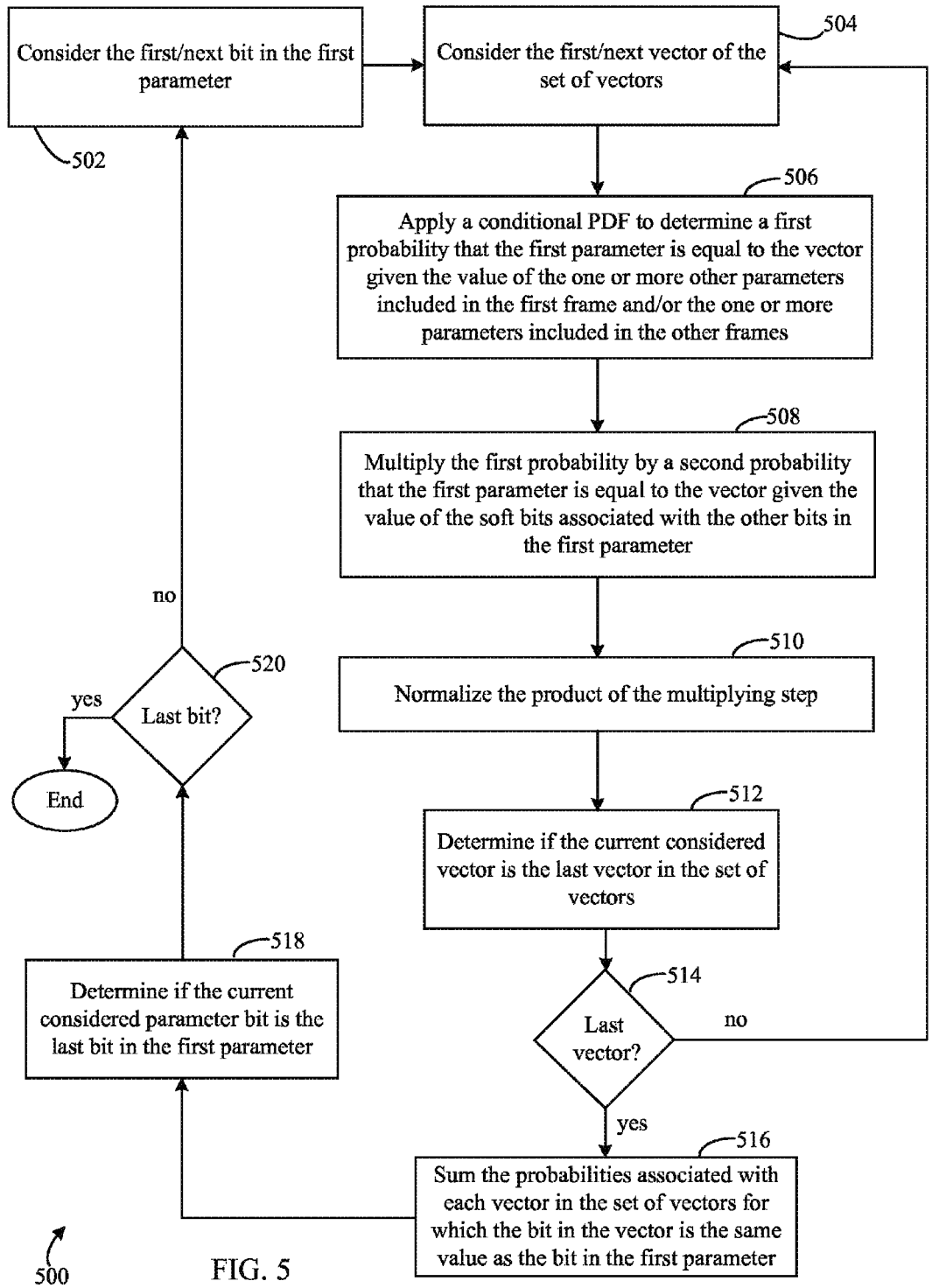
FIG. 5 is a flowchart providing example steps for performing joint source channel decoding using parameter-based correlation, according to an exemplary embodiment.

FIG. 5 shows a flowchart 500 providing example steps for using parameter-based correlation in channel decoding, in exemplary embodiments. In some embodiments, flowchart 500 may be a further embodiment those set forth herein, e.g., jitter buffer enhanced JSCD embodiments, and with respect to Equations 3 and 4 described above. LTE architecture 200 of FIG. 2, JSCD block 216 of FIGS. 2 & 3, jitter buffer implementation 300 of FIG. 3, computer 600 of FIG. 6, and/or any of their respective components/circuits may each operate according to flowchart 500, in embodiments. Further, as describe herein with respect to flowchart 500, a first parameter may comprise one of a predefined set of vectors as shown, for instance, above in the example of parameter domain correlation in Section 6. Other structural and operational embodiments will be apparent to persons skilled in the relevant art(s) based on the discussion regarding flowchart 500. Flowchart 500 is described as follows.

Flowchart 500 may begin with step 502. In step 502, the first or next bit in the first parameter are considered. Each bit in the parameter may be considered, as will become apparent in the description of flowchart 500. That is, for each bit in the first parameter, the steps that follow may be performed. For example, each bit m of the illustrative M-bit parameter described in the example of parameter domain correlation in Section 6 is considered.

In step 504, the first or next vector of the set of vectors is considered. Each vector in the set is be considered for each bit considered in step 502, as will become apparent in the description of flowchart 500. That is, for each bit in the first parameter, each vector in the set of vectors is considered. For example, each vector $\underline{x}_0^1$ through $\underline{x}_0^7$ described in the example of parameter domain correlation in Section 5 and Table 1 is considered for each bit of the parameter. Once a vector is considered, the flowchart proceeds to the next step (506).

In step 506, a conditional probability density function (PDF) is applied to determine a first probability that the first parameter is equal to the vector given the value of the one or more other parameters included in the first frame and/or the one or more parameters included in the other frames. In embodiments, the term $P(\underline{x}_0^i | \hat{\underline{Y}}_{-1})$ of Equation 3 may correspond to the PDF.

In step 508, the first probability is multiplied by a second probability that the first parameter is equal to the vector given the value of the soft bits associated with the other bits in the first parameter. In embodiments, the term $P_m(\underline{x}_0^i | \underline{x}_0 \backslash m)$ of the numerator of Equation 3 may correspond to the second probability.

In step 510, the product of the multiplying step (508) is normalized. This normalization may be performed, for example, using the denominator of Equation 3.

In step 512, it is determined whether the current considered vector is the last vector of the set of vectors. If not, at 514 the flowchart returns to step 504 where the next vector of the set is considered. If so, at 514 the flowchart proceeds to step 516.

In step 516, the probabilities associated with each vector in the set of vectors for which the bit in the vector is the same value as the bit in the first parameter are summed Step 516 may be exemplified in embodiments using Equation 4 described above.

At step 518, it is determined if the current considered parameter bit is the last bit in the first parameter. If not, at 520 the flowchart returns to step 502 where the next bit in the first parameter is considered. If so, from step 520 the flowchart ends.

It is contemplated that, while flowchart 500 may be exemplified by in the example of parameter domain correlation in Section 5, the application of flowchart 500 is not so limited.

In some example embodiments, one or more steps 502, 504, 506, 508, 510, 512, 514, 516, 518, and/or 520 of flowchart 500 may not be performed. Moreover, steps in addition to or in lieu of steps 502, 504, 506, 508, 510, 512, 514, 516, 518, and/or 520 may be performed. Further, in some example embodiments, one or more of steps 502, 504, 506, 508, 510, 512, 514, 516, 518, and/or 520 may be performed out of order, in an alternate sequence, or partially (or completely) concurrently with other steps.

11. Example Computer Embodiments

Exemplary embodiments, systems, components, subcomponents, devices, methods, flowcharts, and/or the like described herein, including but not limited to, JSCD block 216, turbo decoder 262, PRAB(s) 264, AMR 218, jitter buffer 256, decompression block 252, decryption block 244, cypher stream block 248, reordering and duplication detection block 240, turbo decoder 214, HARQ block 230, demodulator block 226, memory 270, jitter buffer implementation 300, secondary jitter buffer 302, optional JSCD block 304, flowcharts 400A, 400B, and 500, and/or any further systems, sub-systems, and/or components disclosed herein may be implemented in hardware (e.g., hardware logic/electrical circuitry), or any combination of hardware with software (computer program code configured to be executed in one or more processors or processing devices) and/or firmware. The embodiments described herein, including systems, methods/processes, and/or apparatuses, may be implemented using well known processing devices, telephones (smart phones and/or mobile phones), servers, and/or, computers, such as a computer 600 shown in FIG. 6. It should be noted that computer 600 may represent communication devices, processing devices, and/or traditional computers in one or more embodiments. For example, LTE architecture 200, jitter buffer implementation 300, and any of the sub-systems or components respectively contained therein may be implemented using one or more computers 600.

Computer 600 can be any commercially available and well known communication device, processing device, and/or computer capable of performing the functions described herein, such as devices/computers available from International Business Machines®, Apple®, Sun®, HP®, Dell®, Cray®, Samsung®, Nokia®, etc. Computer 600 may be any type of computer, including a desktop computer, a server, etc. Computer 600 includes one or more processors (also called central processing units, or CPUs), such as a processor 606. Processor 606 is connected to a communication infrastructure 602, such as a communication bus. In some embodiments, processor 606 can simultaneously operate multiple computing threads. Computer 600 also includes a primary or main memory 608, such as random access memory (RAM). Main memory 608 has stored therein control logic 624 (computer software), and data. Computer 600 also includes one or more secondary storage devices 610. Secondary storage devices 610 include, for example, a hard disk drive 612 and/or a removable storage device or drive 614, as well as other types of storage devices, such as memory cards and memory sticks. For instance, computer 600 may include an industry standard interface, such a universal serial bus (USB) interface for interfacing with devices such as a memory stick. Removable storage drive 614 represents a floppy disk drive, a magnetic tape drive, a compact disk drive, an optical storage device, tape backup, etc.

Removable storage drive 614 interacts with a removable storage unit 616. Removable storage unit 616 includes a computer useable or readable storage medium 618 having stored therein computer software 626 (control logic) and/or data. Removable storage unit 616 represents a floppy disk, magnetic tape, compact disk, DVD, optical storage disk, or any other computer data storage device. Removable storage drive 614 reads from and/or writes to removable storage unit 616 in a well-known manner. Computer 600 also includes input/output/display devices 604, such as touchscreens, LED and LCD displays, monitors, keyboards, pointing devices, etc. Computer 600 further includes a communication or network interface 618. Communication interface 620 enables computer 600 to communicate with remote devices. For example, communication interface 620 allows computer 600 to communicate over communication networks or mediums 622 (representing a form of a computer useable or readable medium), such as LANs, WANs, the Internet, etc. Network interface 620 may interface with remote sites or networks via wired or wireless connections. Control logic 628 may be transmitted to and from computer 600 via the communication medium 622.

Any apparatus or manufacture comprising a computer useable or readable medium having control logic (software) stored therein is referred to herein as a computer program product or program storage device, including but not limited to, computer 600, main memory 608, secondary storage devices 610, and removable storage unit 616. Such computer program products, having control logic stored therein that, when executed by one or more data processing devices, cause such data processing devices to operate as described herein, represent embodiments of the invention. Devices in which embodiments may be implemented may include storage, such as storage drives, memory devices, and further types of computer-readable media. Examples of such computer-readable storage media include a hard disk, a removable magnetic disk, a removable optical disk, flash memory cards, digital video disks, random access memories (RAMs), read only memories (ROM), and the like. As used herein, the terms "computer program medium" and "computer-readable medium" are used to generally refer to the hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable storage media may store program modules that include computer program logic to implement, for example, embodiments, systems, components, subcomponents, devices, methods, flowcharts, and/or the like described herein (as noted above), and/or further embodiments described herein. Embodiments of the invention are directed to computer program products comprising such logic (e.g., in the form of program code, instructions, or software) stored on any computer useable medium. Such program code, when executed in one or more processors, causes a device to operate as described herein.

Note that such computer-readable storage media are distinguished from and non-overlapping with communication media (do not include communication media). Communication media typically embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media. Embodiments are also directed to such communication media.

12. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A method, comprising:
   storing a plurality of hard bits in a first memory buffer;
   storing a plurality of soft bits in a second memory buffer; and
   performing joint source channel decoding on a first subset of the plurality of soft bits based upon one or more of at least a portion of the plurality of hard bits and a second subset of the plurality of soft bits,
   the first subset being associated with a first segment of an audio signal, and the one or more of at least a portion of the plurality of hard bits and the second subset being associated with a second segment of the audio signal that was generated subsequent to the first segment.

2. The method of claim 1, wherein performing joint source channel decoding comprises predicting a value of a soft bit in the first subset based on a parameter correlation between the first subset, and one or more of the at least a portion of the plurality of hard bits and the second subset.

3. The method of claim 2, wherein the parameter comprises at least one of a speech parameter or a packet field parameter.

4. The method of claim 3, wherein the speech parameter comprises at least one of pitch, pitch gain, fixed codebook gain, or linear spectral pairs, and
   wherein the packet field parameter comprises at least a portion of one of a media access control (MAC) header, a radio link control (RLC) header, a packet data convergence protocol (PDCP) header, a robust header compression (RoHC) header, a real-time protocol (RTP) header, or transport block padding.

5. The method of claim 1, wherein each subset of the plurality of soft bits corresponds to a respective position in the first memory buffer; and
   wherein the first subset corresponds to a penultimate position in the first memory buffer.

6. The method of claim 1, further comprising:
   storing an additional plurality of hard bits in a third memory buffer, the additional plurality of hard bits being associated with a third segment of an audio signal that has been decoded by a speech decoder;
   wherein performing the joint source channel decoding on the first subset of the plurality of soft bits is further based upon the additional plurality of hard bits.

7. The method of claim 1, further comprising at least one of:
   storing hard bits associated with the first subset of soft bits and generated by the performed joint source channel decoding in the first memory buffer; or
   providing the hard bits associated with the first subset of soft bits to a speech decoder.

8. A method, comprising:
   storing a plurality of hard bits in a first memory buffer;
   storing a plurality of soft bits in a second memory buffer, the plurality of soft bits comprising two or more subsets of soft bits; and
   performing joint source channel decoding on each of the two or more subsets based upon at least a portion of the plurality of hard bits and each other subset,
   a first subset of the two or more subsets being associated with a first segment of an audio signal, and one or more of the at least a portion of the plurality of hard bits and a second subset of the two or more subsets being associated with a second segment of the audio signal that was generated subsequent to the first segment.

9. The method of claim 8, further comprising:
storing decoded hard bits in the first memory buffer, wherein the two or more subsets comprises at least three subsets, and wherein the decoded hard bits are based upon a first subset of the at least three subsets; and
performing an additional joint source channel decoding on each subset of the one or more subsets other than the first subset based upon the at least a portion of the plurality of hard bits, the decoded hard bits, and each other subset other than the first subset.

10. The method of claim 8, wherein performing joint source channel decoding comprises predicting a value of a soft bit of each respective subset of soft bits based on a parameter correlation between at least one of the two or more subsets, and one or more of the at least a portion of the plurality of hard bits and each other subset.

11. The method of claim 10, wherein the parameter comprises at least one of a speech parameter or a packet field parameter.

12. The method of claim 11, wherein the speech parameter comprises at least one of pitch, pitch gain, fixed codebook gain, or linear spectral pairs, and
wherein the packet field parameter comprises at least a portion of one of a media access control (MAC) header, a radio link control (RLC) header, a packet data convergence protocol (PDCP) header, a robust header compression (RoHC) header, a real-time protocol (RTP) header, or transport block padding.

13. The method of claim 8, wherein each subset of the plurality of soft bits corresponds to a respective position in the first memory buffer; and
wherein the first subset corresponds to a penultimate position in the first memory buffer.

14. The method of claim 8, further comprising:
storing an additional plurality of hard bits in a third memory buffer, the additional plurality of hard bits being associated with a third segment of an audio signal that has been decoded by a speech decoder;
wherein performing joint source channel decoding on each of the two or more subsets is further based upon the additional plurality of hard bits.

15. A system, comprising:
a first memory buffer configured to store a plurality of hard bits;
a second memory buffer configured to store a plurality of soft bits; and
a channel decoder configured to perform joint source channel decoding on a first subset of the plurality of soft bits based upon one or more of at least a portion of the plurality of hard bits and a second subset of the plurality of soft bits,
the first subset being associated with a first segment of an audio signal, and the one or more of at least a portion of the plurality of hard bits and the second subset of the plurality of soft bits being associated with a second segment of the audio signal that was generated subsequent to the first segment.

16. The system of claim 15, wherein the channel decoder comprises:
a packet redundancy analyzer configured to:
receive the first subset,
receive one or more of the at least a portion of the plurality of hard bits and the second subset of the plurality of soft bits,
generate a second plurality of soft bits based at least on a parameter correlation between the first subset, and one or more of the at least a portion of the plurality of hard bits and the second subset, and
output the second plurality of soft bits; and
a turbo decoder configured to:
receive the second plurality of soft bits,
generate a second plurality of hard bits based at least on the third plurality of soft bits, and
output the second plurality of hard bits to the first memory buffer.

17. The system of claim 15, wherein performing joint source channel decoding comprises predicting a value of a soft bit in the first subset based on a parameter correlation between the first subset, and one or more of the at least a portion of the plurality of hard bits and the second subset.

18. The system of claim 17, wherein the parameter comprises at least one of a speech parameter or a packet field parameter.

19. The system of claim 15, wherein the channel decoder is configured to perform joint source channel decoding on each subset of the plurality of soft bits based upon one or more of at least a portion of the plurality of hard bits and each other subset.

20. The system of claim 15, wherein each subset of the plurality of soft bits corresponds to a respective position in the first memory buffer; and
wherein the first subset corresponds to a penultimate position in the first memory buffer.

* * * * *